(12) United States Patent
Yamakawa et al.

(10) Patent No.: US 10,697,904 B2
(45) Date of Patent: Jun. 30, 2020

(54) X-RAY DETECTION SYSTEM, X-RAY DEVICE, AND DEVICE AND METHOD FOR PROCESSING X-RAY DETECTION DATA

(71) Applicant: JOB CORPORATION, Kanagawa (JP)

(72) Inventors: Tsutomu Yamakawa, Kanagawa (JP); Shuichiro Yamamoto, Kanagawa (JP); Masashi Yamasaki, Kanagawa (JP); Masahiro Okada, Kanagawa (JP)

(73) Assignee: JOB CORPORATION, Kanagawa (JP)

( * ) Notice: Subject to any disclaimer, the term of this patent is extended or adjusted under 35 U.S.C. 154(b) by 0 days.

(21) Appl. No.: 15/737,835

(22) PCT Filed: Mar. 27, 2017

(86) PCT No.: PCT/JP2017/012403
§ 371 (c)(1),
(2) Date: Dec. 19, 2017

(87) PCT Pub. No.: WO2017/170408
PCT Pub. Date: Oct. 5, 2017

(65) Prior Publication Data
US 2019/0017943 A1    Jan. 17, 2019

(30) Foreign Application Priority Data

Mar. 31, 2016   (JP) .................... 2016-069887

(51) Int. Cl.
*G01B 15/06*      (2006.01)
*H05G 1/64*       (2006.01)
(Continued)

(52) U.S. Cl.
CPC ............. *G01N 23/18* (2013.01); *G01N 23/04* (2013.01); *G01N 23/046* (2013.01); *G01T 1/17* (2013.01);
(Continued)

(58) Field of Classification Search
CPC ....... G01N 2223/401; G01N 2223/643; G01N 23/04; G01N 23/046; G01N 23/18;
(Continued)

(56) References Cited

U.S. PATENT DOCUMENTS

| 5,952,646 A | 9/1999 | Spartiotis et al. |
| 10,277,830 B2 * | 4/2019 | Sano ...................... H04N 5/355 |

(Continued)

FOREIGN PATENT DOCUMENTS

| EP | 2 674 787 | 12/2013 |
| JP | 2000-069369 | 3/2000 |

(Continued)

*Primary Examiner* — Irakli Kiknadze
(74) *Attorney, Agent, or Firm* — Clark & Brody LP

(57) ABSTRACT

An X-ray apparatus includes a two-dimensional pixel array having rectangular pixels outputting an electrical signal responsively to an incident X-ray photon. This array has a row direction oblique to a scan direction. When viewing in the scan direction, a pixel group is provided solely or repeatedly, the pixel group being composed of "M rows × N pieces" of pixels (M is a positive integer equal to or larger than 1, N is a positive integer equal to or larger than 2, and M and N have a relationship of prime numbers). The pixel group occupies a quadrangle whose diagonal line is parallel with the scan direction. In a memory space, the frame data from the pixels are converted to frame data in a Cartesian coordinate system having a row direction which is in parallel with the scan direction and a column direction orthogonal to the row direction.

20 Claims, 17 Drawing Sheets

(51) Int. Cl.
*G01N 23/18* (2018.01)
*G01N 23/04* (2018.01)
*G01N 23/046* (2018.01)
*G01T 1/17* (2006.01)
*G01T 1/29* (2006.01)
*H01L 27/146* (2006.01)
*H04N 5/32* (2006.01)
*G06T 11/00* (2006.01)

(52) U.S. Cl.
CPC ...... *G01T 1/2928* (2013.01); *H01L 27/14634* (2013.01); *H04N 5/32* (2013.01); *G01N 2223/401* (2013.01); *G01N 2223/643* (2013.01); *G06T 11/008* (2013.01)

(58) Field of Classification Search
CPC .. G01N 2223/619; G01N 23/044; G01T 1/17; G01T 1/2928; G06T 11/008; H01L 27/14634; H04N 5/32; A61B 6/02; A61B 6/12; A61B 6/14; G06F 13/10; G06F 13/1689; G06F 13/385; G01B 5/26

USPC ..................... 378/19.58, 62, 98.9
See application file for complete search history.

(56) References Cited

U.S. PATENT DOCUMENTS

| | | | |
|---|---|---|---|
| 2010/0067773 | A1 | 3/2010 | Yamaguchi |
| 2012/0049077 | A1* | 3/2012 | Okada ............... H01L 27/14603 250/370.08 |
| 2013/0068952 | A1* | 3/2013 | Kuwabara ............... G01T 1/243 250/366 |
| 2014/0138553 | A1 | 5/2014 | Ogawa et al. |
| 2016/0349192 | A1 | 12/2016 | Yamakawa et al. |

FOREIGN PATENT DOCUMENTS

| | | |
|---|---|---|
| JP | 2004-325183 | 11/2004 |
| JP | 2006-101926 | 4/2006 |
| JP | 2010-125249 | 6/2010 |
| WO | 2015/111728 | 7/2015 |

* cited by examiner

FIG.9

[CONVERSION PATTERN]

| PATTERN | POSITONS OF PIXELS ADJACENT TO EACH PIXEL P' | AREA RATIO |
|---|---|---|
| 1 | ××× | ×× |
|  | ××× | ×× |
|  | ××× | ×× |
|  | ××× | ×× |
| 2 | LOWER SIDE | S1 |
|  | UPPER SIDE | S2 |
|  | UPPER RIGHT SIDE | S3 |
|  | LOWER RIGHT SIDE | S4 |
|  | UPPER LEFT SIDE | S5 |
| 3 | ××× | ×× |
|  | ××× | ×× |
|  | ××× | ×× |
|  | ××× | ×× |
|  | ××× | ×× |
| 4 | ××× | ×× |
|  | ××× | ×× |
|  | ××× | ×× |
|  | ××× | ×× |

FIG.13
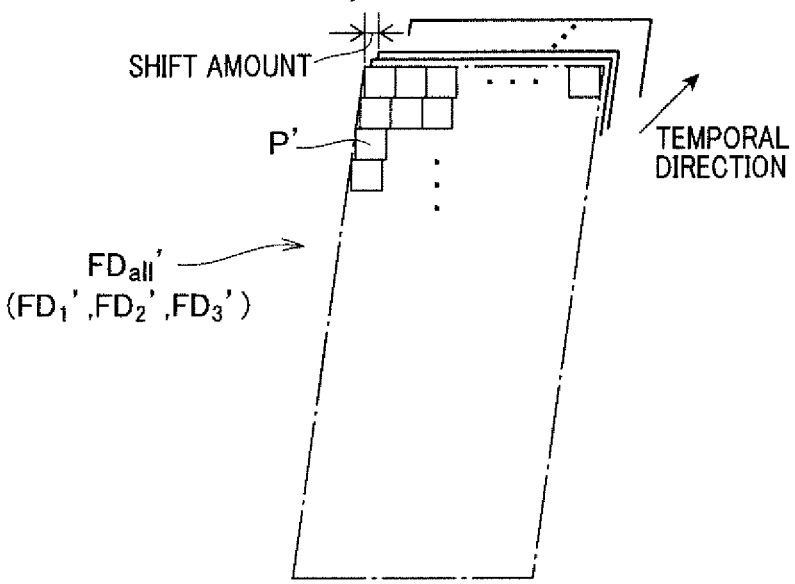
(A) SCAN DIRECTION (Z-AXIS DIRECTION)
SHIFT AMOUNT
P'
TEMPORAL DIRECTION
$FD_{all}'$ ($FD_1'$, $FD_2'$, $FD_3'$)
SHIFT & ADD OF FRAME DATA
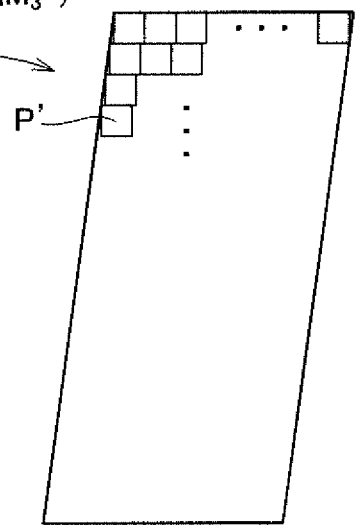
(B) $IM_{all}'$ ($IM_1'$, $IM_2'$, $IM_3'$) [RECONSTRUCTED IMAGE]
P'

X-RAY DETECTION SYSTEM, X-RAY DEVICE, AND DEVICE AND METHOD FOR PROCESSING X-RAY DETECTION DATA

CROSS-REFERENCE TO RELATED APPLICATION

This application is based on and claims the benefit of priority from earlier Japanese Patent Application No. 2016-069887 filed on Mar. 31, 2016, the description of which is incorporated herein by reference.

TECHNICAL FIELD

The present invention relates to a detector which detects X-rays which have been radiated from an X-ray source and transmitted through an object, and a data processor which processes X-ray data detected by this detector. In particular, the present invention relates to a detector provided with two-dimensionally arrayed X-ray detection pixels which are allocated obliquely to an X-ray scan direction, and a data processor which processes X-ray data detected by this detector.

BACKGROUND ART

In recent years, from the perspective of public health and food safety, there has been an increasing need for inspection for foreign matter that may be contained inside food products.

While the methods of X-ray inspection are numerous, an inspection method that is receiving attention is a method in which X-rays are used to collect information on a substance inside a food product. As an example for achieving the foregoing, a so-called in-line-type X-ray inspection apparatus is known. In the in-line-type X-ray inspection apparatus, an X-ray tube and a detector are arranged above and below a conveyor belt that is sandwiched therebetween. The in-line-type X-ray inspection apparatus uses X-rays to inspect a food product to be inspected that is placed on the belt. In this apparatus, the food product to be inspected is placed on the belt (line) and conveyed such as to pass through an X-ray radiation field of the X-ray tube. The scan direction of X-rays is made to agree with the belt conveyance direction.

In this way, food passes through a space between the X-ray tube and the detector (i.e., an object space), and the X-rays which have been transmitted through the food are detected by the detector located under the belt. The detected data is then used to generate images by a processor such as a computer. The generated images are then subjected to an image process conducted by software, for instance, thereby examining existence/non-existence or types of foreign matter which may contaminate the food. The object being examined is not always limited to food, but may be any item which causes significant contrast differences by the X-rays. Such objects may be an object whose size, shape and/or weight should be necessary to be measured accurately.

As a detector which can be mounted in an X-ray inspection apparatus, there is known an X-ray detector disclosed by Patent Reference 1. This X-ray detector is provided as a radiation detector equipped with a plurality of modules each having a plurality of detection elements each composing a pixel, The respective pixels convert incident X-rays to electrical data whose amounts correspond to the X-ray amounts. In this detector, there is provided a scan direction which is set to agree with one of the first X-axis and the first Y-axis perpendicular to the first X-axis. The plural modules are aligned juxtaposed to each other, but with a known gap width formed therebetween, along at least one of the first X- and Y-axes on the same plane. The plural detection elements of the modules are located obliquely to the first X-axis (or the first Y-axis) and two-dimensionally allocated along the second X- and Y-axes perpendicular to each other.

Moreover, the X-ray detector disclosed by this Patent Reference 1 is intended to perform correction for a reduction of X-ray amounts and influence resulting from non-existent pixels between mutually adjacent modules, that is, GAP correction. For this purpose, the plural modules are arranged obliquely to the scan direction, whereby the pixels of each of the modules are also allocated obliquely to the scan direction. It is therefore possible to virtually assign pixel values to the gaps when being scanned, thus greatly reducing influence of the non-sensitive zones of the detector on images to be generated.

CITATION LIST

Patent Literature

[PTL 1] WO 2012/086648 A1
[PTL 2] U.S. Pat. No. 5,952,646
[PTL 3] JP-A 2010-125249
[PTL 4] JP-A 2000-069369
[PTL 5] JP-A 2004-325183
[PTL 6] JP-A 2006-101926

By the way, this kind of oblique arrangement of the modules, that is, oblique arrangement of pixels of the modules, to the scan direction, such as being configured in the foregoing Patent Reference 1, can be provided by many other references, such as Patent References 2 to 6.

Technical Problem

In this situation, when using this X-ray detector, it is necessary to convert detected data, that is, frame data, to frame data according to the initial (i.e., before being obliquely set) Cartesian coordinate system whose one axis is along the scan direction. Hence, in the system adopting the foregoing oblique-arrangement X-ray detector, a sub-pixel technique is, by way of example, used to convert the detected frame data to frame data in the initial Cartesian coordinate system.

On one hand, there has been a strong demand for improving accuracy in inspecting foreign matter which may be contained in food or other objects. As one type of this foreign matter inspection apparatus, there is known an in-line X-ray inspection apparatus. This apparatus can be used preferably in inspecting many kinds of food in the line production. One typical example of this apparatus is that the apparatus is provided with a conveyor belt running at a speed, for example, of 60 m/min. and food to be inspected (e.g., vegetables such as green peppers, food such as baked bread, or meat blocks) is placed on the conveyor belt. Above the conveyor belt, an X-ray generator is installed and, under the belt on which the food is placed, i.e., in a space enclosed by the circulated belt, a strip-shaped X-ray detector is installed which has a detection window covering the width of the belt. Frame data outputted at a constant rate from the detector are subjected, for example, to mutual addition in synchronization with a running speed of the conveyor belt, which is able to generate X-ray tomographic images of an object for the inspection.

In this way, in this apparatus, it is required to process the outputted frame data at a higher processing speed. By necessity, the higher-speed processing will raise amounts of calculation (i.e., calculation load) carried out in a processing apparatus (including a CPU) which generates images. One solution to meet such larger amounts of calculation is parallel use of a plurality of calculators or installment of a calculator with a higher-speed calculation function. However, such a solution results in an increase in parts cost and/or growth in the apparatus size.

SUMMARY

In view of situations of the conventional X-ray examination, it is thus desired to provide an X-ray examination in which an X-ray beam is scanned along a scan direction in an object space in which the rows of pixels are allocated obliquely to the scan direction, and in this structure, the X-ray examination can be performed with greatly suppressed statistical noise, while still greatly suppressing deterioration of a scan resolution, in a state where the circuitry can avoid becoming larger in size and a calculation amount is reduced when the frame data from the detector is converted to a coordinate system perpendicular to the scan direction.

For the foregoing object, according to an exemplary embodiment, there is provided an X-ray apparatus characterized in that the apparatus comprises: a detector provided with a two-dimensional pixel array, the two-dimensional pixel array having a plurality of pixels each being shaped into a rectangular, having a predetermined size and outputting an electrical signal in response to an incident X-ray photon, the plurality of pixels being allocated in mutually-orthogonal row and column directions both configuring a first Cartesian coordinate system, the row direction being oblique to a scan direction with a predetermined angle; and a processor that processes as a two-dimensional frame data the signals outputted at a constant period from the respective pixels of the two-dimensional pixel array. The two-dimensional pixel array is allocated such that, when viewing from any one of sides in the scan direction, a pixel group is provided solely or repeatedly, the pixel group being composed of "M columns×N pieces" of pixels (M is a positive integer equal to or larger than 1, N is a positive integer equal to or larger than 2, and M and N have a relationship of prime numbers), the group of pixels providing a quadrangle whose diagonal line is parallel with the scan direction such that the oblique arrangement is provided. Further, the processor is provided with conversion means which convert at the constant periods the frame data, outputted at the constant period from the respective pixels of the two-dimensional pixel array, to frame data in a second Cartesian coordinate system configured in a memory space, the second Cartesian coordinate system having a row direction which is set to accord with the scan direction and a column direction orthogonal to the row direction.

In the exemplary embodiment, the scanning is performed in the object space in which the detector pixel rows are allocated obliquely to the scan direction of an X-ray beam. By this oblique allocation of the pixels, statistical noise can be minimized while still minimizing a deterioration in resolution in the scanning. In addition, the diagonal line of a quadrangle formed by a group of pixels defined as "M rows×N pieces" pixels (M is a positive integer equal to or larger than 1, N is a positive integer equal to or larger than 2, and M and N have a relationship of prime numbers) is set to be parallel with the scan direction. Hence, the number of conversion patterns which are needed to convert the frame data outputted from the detector to frame data in the coordinate system perpendicular to the scan direction is limited to a predetermined value. Circuitry and processing amounts for image reconstruction can be reduced greatly.

BRIEF DESCRIPTION OF DRAWINGS

In the accompanying drawings:

FIG. 9 is an illustration pictorially showing conversion patterns used for pixel conversions of the Cartesian coordinates;

FIG. 13 is an illustration pictorially explaining a reconstruction process performed in the first embodiment;

DESCRIPTION OF EMBODIMENTS

Embodiments of an X-ray apparatus according to the present invention will hereinafter be described with reference to the accompanying drawings.

[First Embodiment]

With reference to FIGS. 1 to 13, a first embodiment of the X-ray apparatus will now be described. In the present embodiment, the X-ray apparatus is brought into practice as an X-ray foreign-matter inspection apparatus, but not limited to be applied to such an X-ray foreign-matter inspection apparatus.

For example, the X-ray apparatus can also be practiced as X-ray apparatuses, such as medical X-ray mammography apparatuses, in which there are provided an X-ray generator serving as an X-ray source generating an X-ray beam and an X-ray detector with a plurality of rectangular (which conceptually includes "square") X-ray detecting pixels in order to scan an object being examined (which conceptually includes "a patient") with an X-ray beam in a predetermined scan direction. The scan direction is not always linear, but may be two-dimensionally or three-dimensionally curved. As will be described later, the scan direction may be along a curve as described above, as long as a linearity which can be regarded as being linear can be obtained from a group of pixels designated among the plurality of rectangular (or square) poxes.

Figure 1:
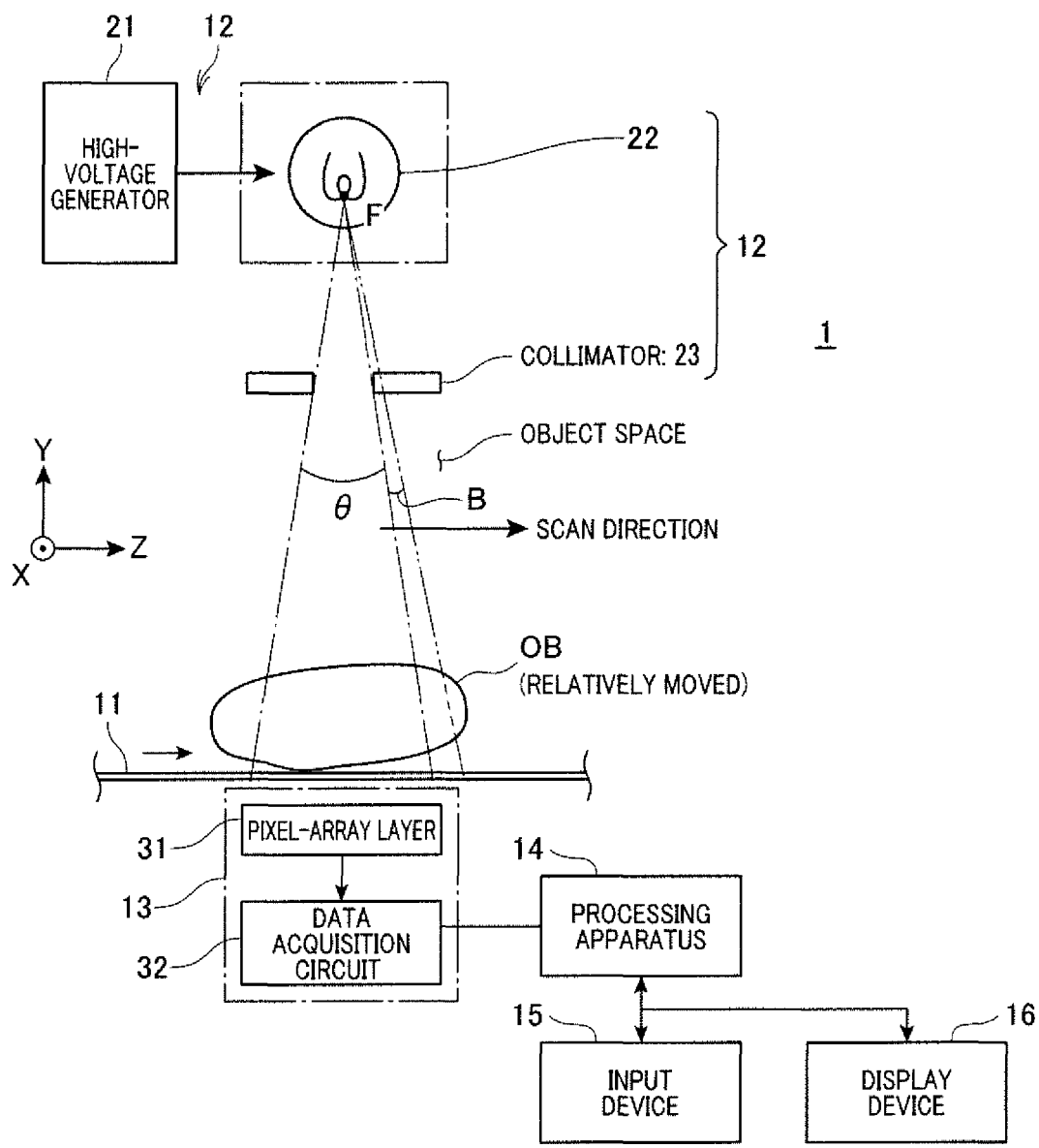
FIG. 1 is a block diagram outlining the configuration of an X-ray foreign-matter inspection apparatus serving as an X-ray apparatus, according to a first embodiment.

FIG. 1 shows an outlined configuration of an X-ray foreign-matter inspection apparatus 1. This apparatus 1 is equipped with an X-ray generator 12 disposed above a conveyor belt 11 to carry an object OB being inspected thereon and an X-ray detector 13 (hereinafter simply referred to as a detector) disposed immediately below the conveyor belt 11. Moreover, the X-ray foreign-matter inspection apparatus 1 is equipped with a processor 14 which processes data (frame data) outputted from the detector 13. To this processor 14, an input device 15 and a display unit 16 (i.e., a display monitor) are communicably connected, which serve as a user interface.

The X-ray generator 12 is configured by a known structure which has a high-voltage generator 21, an X-ray tube 22 fed with a driving high voltage from the high-voltage generator 21, and a collimator 23 which collimates the X-rays generated by the X-ray tube 22. This configuration enables the X-ray generator 12 to radiate a cone-shaped X-ray beam having a radiation field to be fit to the shape of a detection window of the detector 13, which will be described later.

The detector 13 is also configured to have semiconductor devices with a known structure. The detector 13 is configured by a plurality of modules M connected linearly, thereby showing a slimline rectangular outer contour. The detector 13 has also an X-ray incidence window MD (whose width (i.e., a detection width)=W) whose shape depends on the outer contour.

Each of the modules M is an X-ray detection element, which is called a direct conversion type, which directly converts X-rays to electrical signals. Each module M has for example 20×80 pixels which are composed into a detection layer made of semiconductor materials such as CdTe or CZT, in which, in the present embodiment, each pixel is formed into a square of 0.2 mm×0.2 mm for instance. Although not shown, the detection layer, which provides the plurality of pixels P, has opposite sides to which a charging electrode and a collecting electrode are attached, so that a bias voltage is applied between the electrodes. This structure provides a pixel-array layer 31 for X-ray detection.

By way of example, in total, 29 such modules M are aligned in one direction, which forms the foregoing X-ray incidence window MD having a longitudinal length of approx. 47 cm and a lateral length of 0.4 cm (for example, the number of pixels is 20×2,348, which are arrayed in a Cartesian coordinate system). In this way, the plurality of modules M themselves are arranged linearly, but this arrangement provides a pixel array having a plurality of pixels P in the lateral direction, so that there can be provided a two-dimensional, slim and rectangular direct-conversion type of detector.

In addition, the detector 13 is configured as a photon counting detector capable of counting the number of X-ray photons for every energy bin, based on a view that the X-rays are composed of a group of photons having various amounts of energy. As such energy bins, those shown in FIG. 3 can exemplified, in which four energy bins $Bin_1$ to $Bin_4$ are given. Alternatively, the number of energy bins may be another one which is two or more, as long as the number is given so as to divide all the energy range into a plurality of ranges in each of which is used for counting the number of photons.

By using this detector 13, the intensities of the X-rays are detected as counts (accumulated numbers) of the photons at predetermined intervals in each of pixels P and in each of the energy bins Bin. When a single photon hits a single pixel P, there is generated an electrical pulse whose wave height is dependent on the energy amount thereof. The wave height value of that electrical pulse signal, that is, an energy amount, is then sorted into a corresponding energy bin, Bin, thereby increasing the count by one in that energy bin, Bin. This count is acquired as an amount accumulated during a predetermined period of time (digital amounts), every pixels P and every energy bin, Bin.

The data acquisition circuit 32 which is in charge of this acquisition is layered under the pixel-array layer 31 by using, for example, an ASIC architecture. By raising a sampling frequency of the data acquisition circuit 32 to a higher value, digital counts can be collected from each of, for example, the array of 20×2,348 pixels at a frame rate of 6,600 fps, for example, in each of the energy bins, Bin.

This direct-conversion type of detector 31, including the data acquisition circuit 21, is known, and exemplified by EP publication No. 2 674 787, for instance.

Figure 2:
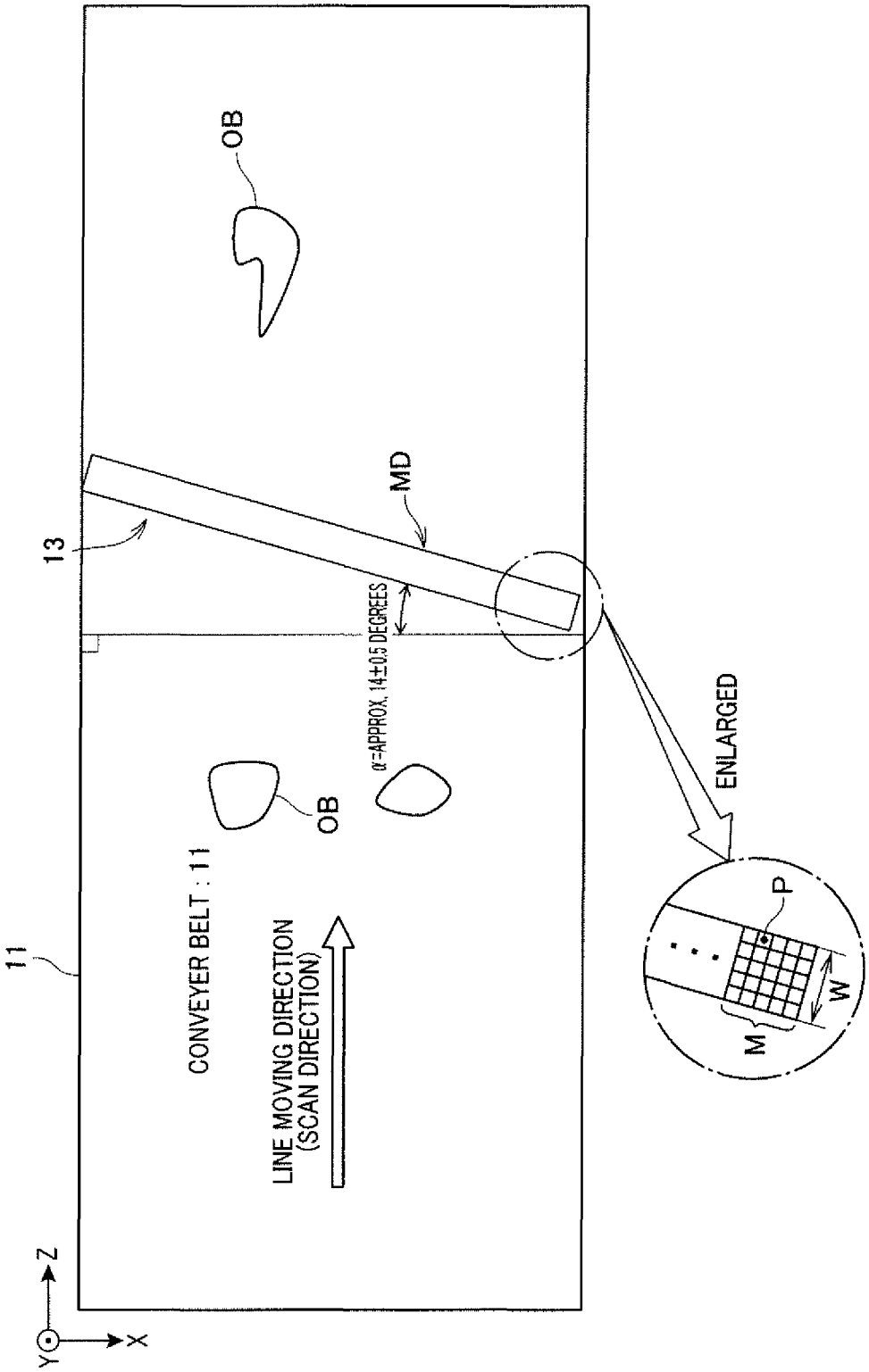
FIG. 2 is an illustration explaining an oblique arrangement of a to detector in the scan direction, which is adopted in the X-ray foreign-matter inspection apparatus.
Figure 3:
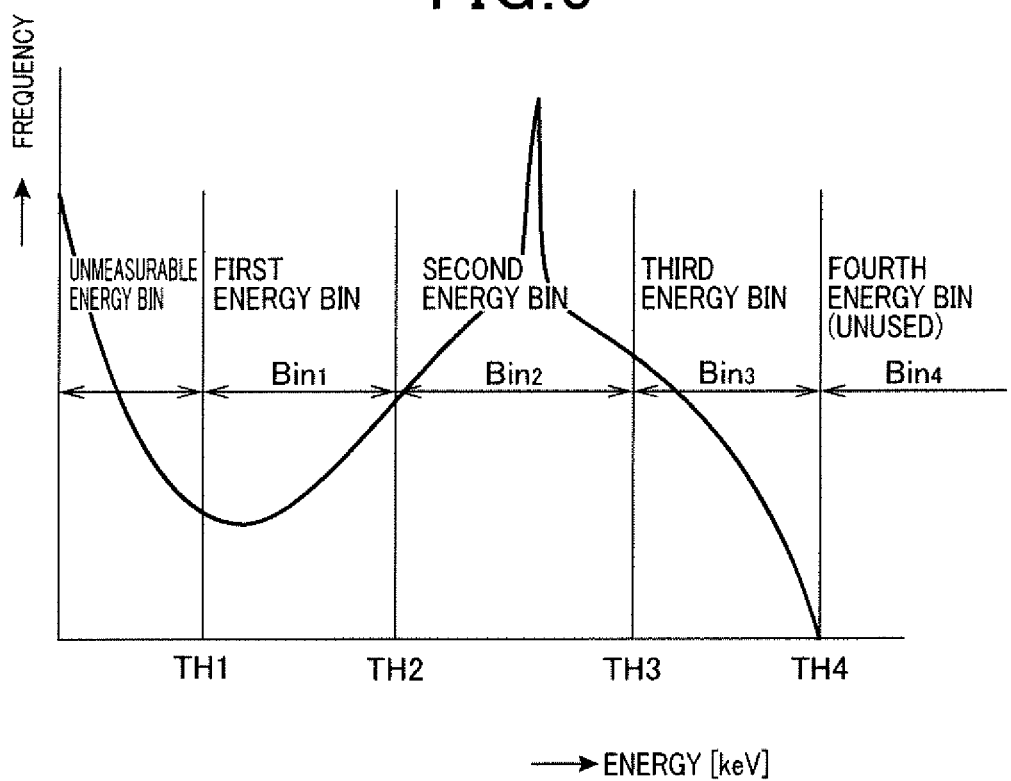
FIG. 3 is a graph explaining both a plurality of energy bins which are set in a photon counting detector and a profile of photon counts.

The detector 13 which can be adopted in the present embodiment may be other types, not absolutely limited to the foregoing direct-conversion type. Another photon counting detector can also be adopted, which is formed by composing SIPM (also called MPPC) combined with microcolumellar scintillators whose diameter is approx. dozens of micrometers, such as a $CeLaCl_3$ detector. Alternatively, the detector 13 may be configured as a conventionally known integral type of detector configured as a combination of a scintillation element and a photoelectric conversion element As illustrated in FIG. 2, this detector 13 is arranged obliquely to the movement direction of the conveyor belt 11, that is, the scan direction Z (also oblique to the belt width direction X. This oblique arrangement results in an oblique arrangement of the square contours of the respective pixels P to the scan direction Z (and to the belt width direction X).

Practically, when the width of the conveyor belt 11 (i.e., the width in the X-axis direction) is approx. 45 cm, an oblique angle α to the belt width direction X perpendicular to the belt movement direction, i.e., the scan direction Z is set to, by way of example, approx. 14.036±0.5 degrees. When this oblique angle α is set such that the diagonal line of a single imaginarily-regarded region composed of four pixels (i.e., square pixels), aligned serially in each row, each having an aspect ratio of 1 to 1, is oriented in the scan direction Z, processing for orthogonal conversion of detected data becomes simplified.

Figure 4:
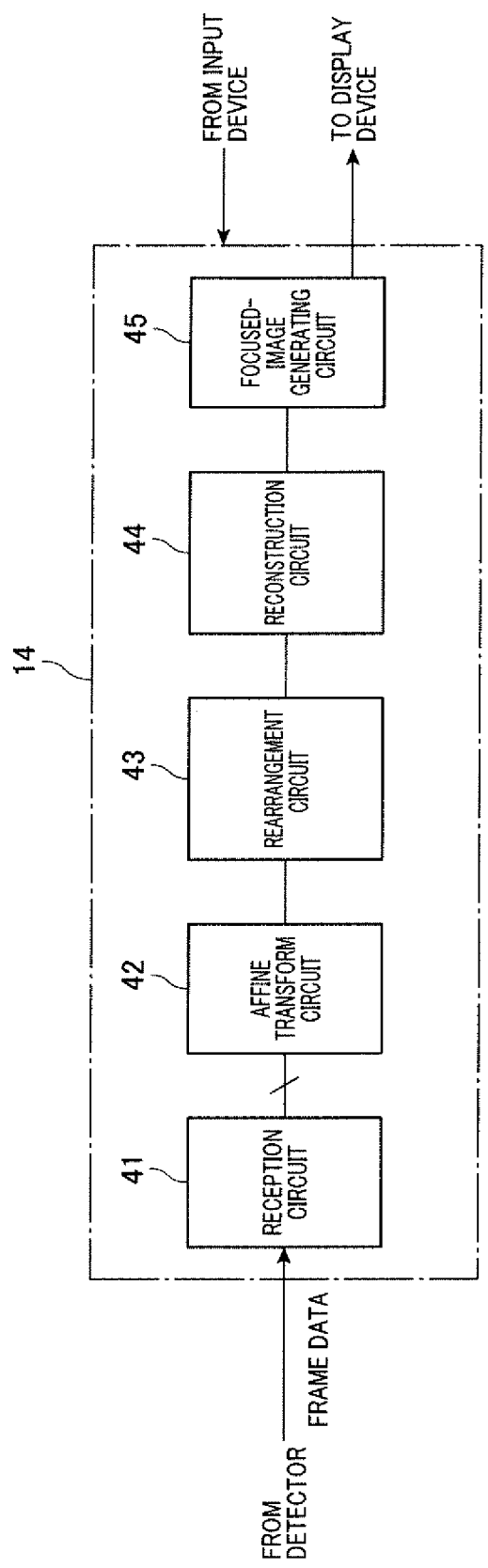
FIG. 4 is a block diagram outlining the configuration of a processor installed in the X-ray foreign-matter inspection apparatus

As shown in FIG. 4, the processor 14 is functionally provided with a reception circuit 41 which receives frame data outputted from the detector 13 energy bin, Bin, as well as an affine transformation circuit 42, a sorting circuit 43, a reconstruction circuit 44, and a focused image generating circuit 45. The affine transformation circuit 42 is configured to affine-transform the orthogonal axes of the frame data. The sorting circuit 43 is configured to sort the affine-transformed frame data. The reconstruction circuit 44 is configured to reconstruct designated one or more tomographic images of an object OB by applying a laminographic technique (also called a tomosynthesis method) to the sorted frame data. The focused image generating circuit 45 is configured to generate all pixel focused images from data of the reconstructed one or more tomographic images.

Figure 6:
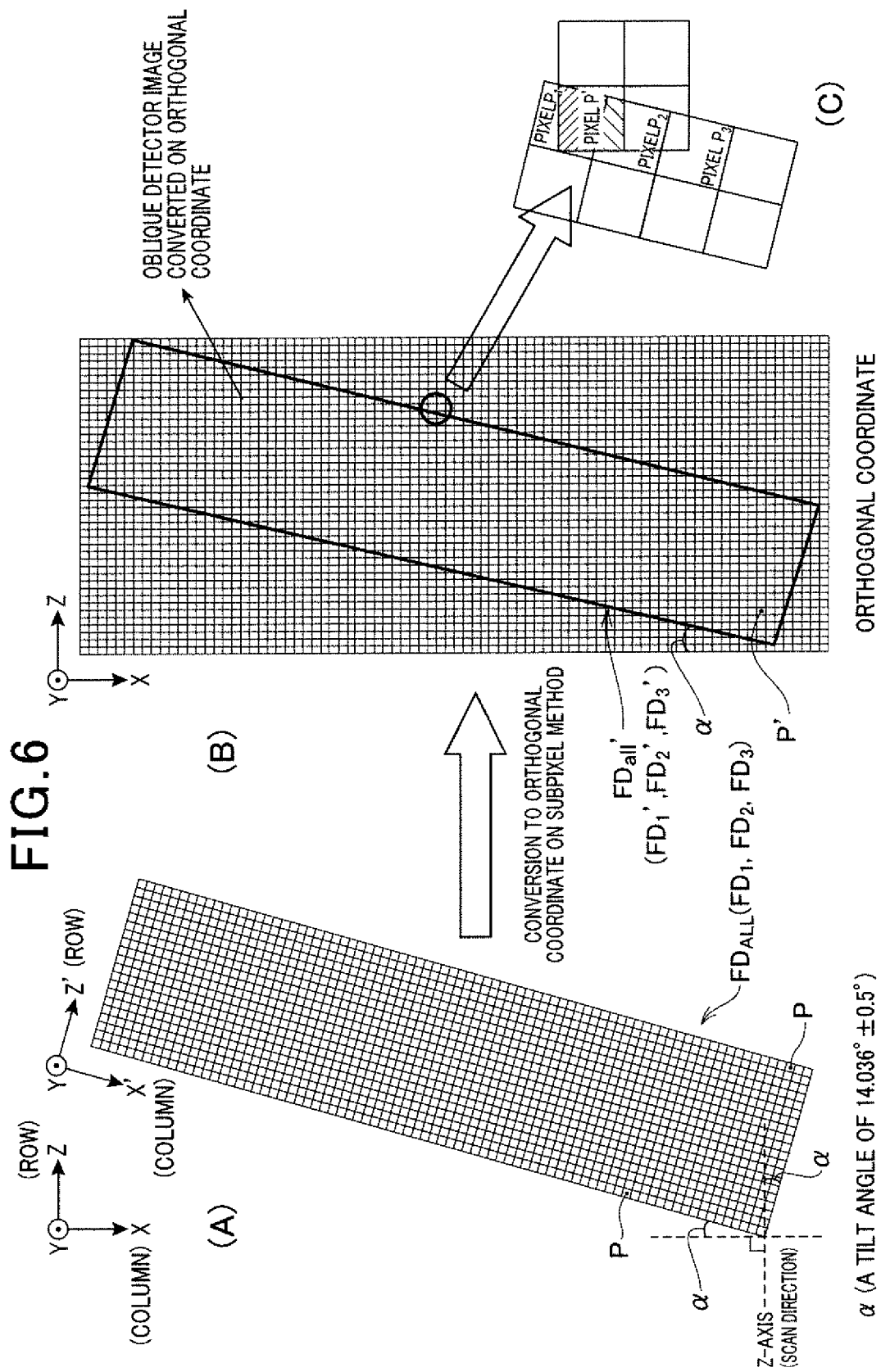
FIG. 6 is an illustration explaining a conversion from an pixel array of a detector obliquely arranged (i.e., a pixel array in an object space, that is, a two-dimensional pixel array allocated in the second Cartesian coordinate system X'YZ'), to a pixel array in a reconstruction space (i.e., a two-dimensional pixel array allocated in the first Cartesian coordinate system XYZ)
Figure 7:
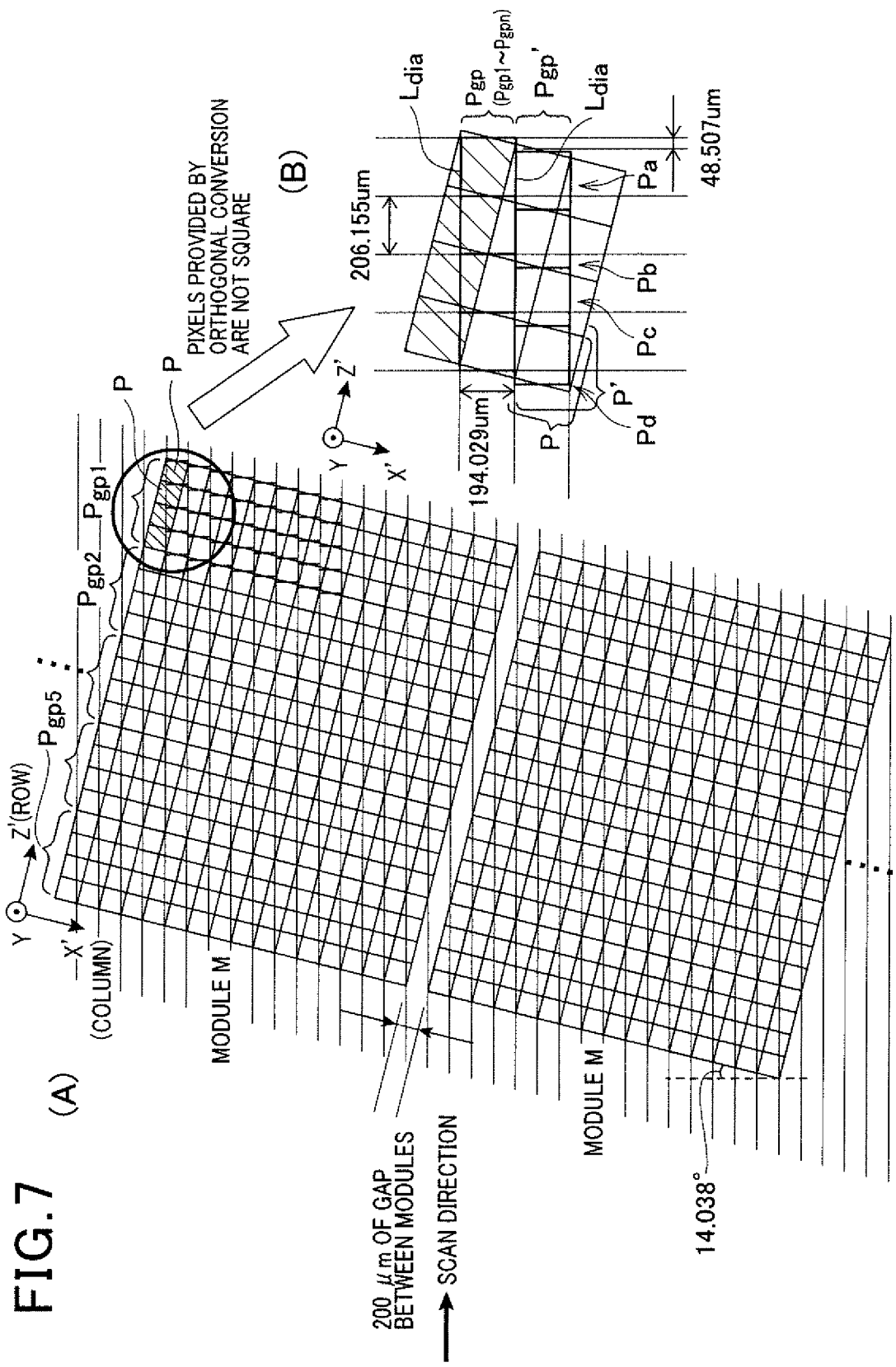
FIG. 7 is another illustration explaining a conversion from the pixel array of the detector obliquely arranged (that is, the two-dimensional pixel array allocated in the second Cartesian coordinate system X'YZ'), to the pixel array in the reconstruction space.

Of these circuits 41 to 45, both the affine transformation circuit 42 and the sorting circuit 43 are unique to the present embodiment, and replacements of an affine transformation circuit shown in FIG. 6 of PCT publication No. WO 2015/111728 A1. Hence, the remaining reception circuit 41, the reconstruction circuit 44 and the focused image generating circuit 45 can be configured to have the same or similar as or to those set forth in WO 2015/111728 A1. Incidentally the processor 14 differs from that shown in FIG. 6 of WO 2015/111728 A1 in that the processor outputs a further type of frame data every energy bin specific to the photon counting. However, basic circuitry related to this additional data output is the same as those set forth in the foregoing publication.

In addition, the circuit of FIG. 6 in the WO 2015/111728 A1 is described by using a hardware circuit which performs a pipeline process, but this is not always limited to such a manner. This circuit may be replaced by a computer equipped with a CPU (central processing unit) and memories or a configuration based on ASIC (Application Specific Integrated Circuit) or FPGA (field-programmable gate array).

The present embodiment exemplifies the processor 14 configured by using an FPGA and configured to be operative under the pipeline process.

Figure 5:
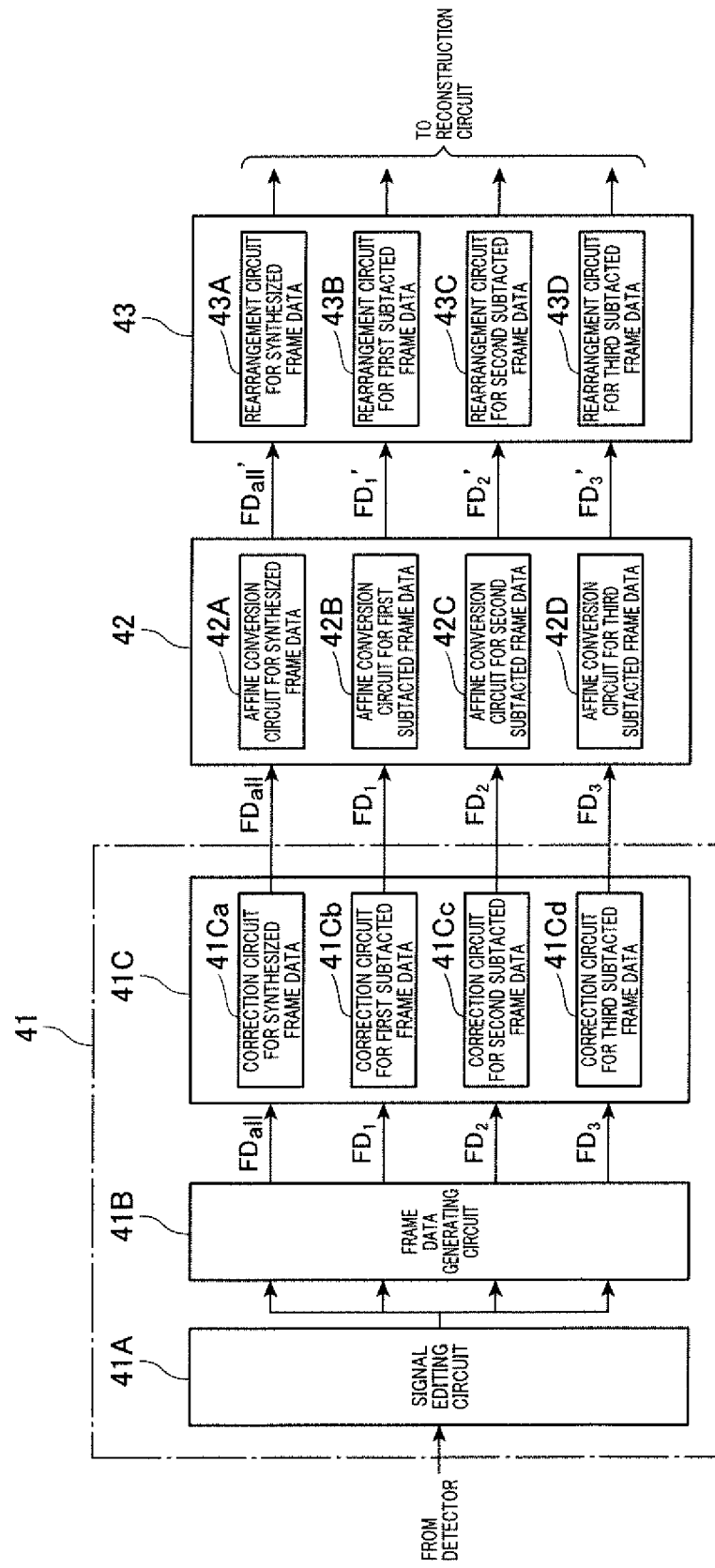
FIG. 5 is a block diagram outlining the configuration of a reception circuit, an affine transformation circuit, and a sorting circuit which are installed in the processor.

As shown in FIG. 5, the reception circuit 41 is connected to the output terminal of the detector 13. This reception circuit 41 is provided with a signal acquisition circuit 41A, a frame data generating circuit 41B, and a correction circuit 41C.

From the data acquisition circuit 32 of the detector 13, digital data indicating counts (i.e., accumulated amounts) of the X-ray photons acquired every pixel P and every energy bin, Bin (refer to FIG. 2) during the predetermined period of time are outputted serially in a first manner (for example, 6,600 FPS). When the signal acquisition circuit 41A receives such serial digital data, the circuit 41A edits the received data into data for all of the data of the receptive v bin, Bin, and outputs the edited data. In other words, in each of all the energy bins Bin1, Bin2, Bin3 and Bin4 at all the pixels P, the count of the X-rays is outputted in sequence as raw frame data. These raw frame data are composed of for example data of 20×2,348 pixels, and outputted in sequence at a cycle of predetermined intervals, every energy bin, Bin.

The raw frame data are outputted to the next frame data generating circuit 41B. This circuit 41B receives sequentially the raw frame data, and uses the received raw frame data to calculate:

synthesized frame data $FD_{ALL}$ in which pixel values of each of the mutually-corresponding pixels P in the four energy bins, $Bin_1$ to $Bin_4$ are added to each other;

a first energy-bin frame data $FD_1$ provided by subtracting, pixel by pixel, pixel values of the raw frame data of the energy bin, $Bin_2$, which is the second from the lower energy side, from those of the energy bin, $Bin_1$, which is the lowest energy bin;

a second energy-bin frame data $FD_2$ provided by subtracting, pixel by pixel, pixel values of the raw frame data of the energy bin, $Bin_3$, which is the third from the lower energy side, from those of the energy bin, $Bin_2$, which is the second from the lower energy side; and a third energy-bin frame data $FD_3$ provided by subtracting, pixel by pixel, pixel values of the raw frame data of the energy bin, $Bin_4$, which is the fourth from the lower energy side (i.e., the highest energy bin), from those of the energy bin, $Bin_3$, which is the third from the lower energy side.

Although being one example, of these calculated frame data, the synthesized frame data $FD_{ALL}$ are used for an X-ray inspection. The first, second and/or third energy-bin frame data FD1, FD2 and/or FD3 are data used to identify (estimate or determine) types of a foreign matter and/or aspects of an object, which is called substance identification. In this way, in generating the frame data, the subtraction is carried out and the X-ray tube voltage is set at the highest energy threshold TH4 (refer to FIG. 3), thereby preventing data in energies larger than the threshold from influencing the image generation. It is thus possible to suppress, as much as possible, erroneous counts counted in the higher energy bins from being contaminated. Such erroneous counts are due to a pile-up phenomenon of X-ray photons which impinges onto each of the pixels P.

As shown in FIG. 6(A), the synthesized frame data $FD_{ALL}$, and the first, second and third energy-bin frame data FD1, FD2 and FD3 are made to be oblique to the X-axis of the two-dimensional orthogonal system in the XZ plane by α degrees (in this example, approx. 14.036±0.5 degrees).

In this example, the Cartesian coordinate system one axis of which is the scan direction (i.e., the Z-axis direction) which has been described so far is referred to as a first Cartesian coordinate system XYZ. This tilt angle of α degrees makes it possible to set a second Cartesian coordinate system X'YZ' whose one axis (i.e., the X'-axis) is along the long-axis direction of the detector 13. In other words, in FIG. 6(A), the second Cartesian coordinate system X'YZ' is rotated clockwise by α degrees from the first Cartesian coordinate system XYZ on the Y-axis in the XZ plane.

The four types of frame data $FD_{all}$, $FD_1$, $FD_2$ and $FD_3$, which are outputted from the frame data generating circuit 41B, are then provided to the next-stage correction circuit 41C. As shown in FIG. 5, this correction circuit 41C includes a synthesized frame correction circuit 41Ca, a first subtracted correction circuit 41Cb, a second subtracted correction circuit 41Cc, and a third subtracted correction circuit 41Cd, which are individual and parallel with each other in circuitry therein. To these correction circuits 41Ca to 41Cd, various types of correction information is given from the system side, in which the correction information includes information about correction of dead pixels which have been found previously by the system, correction of pixel intensities, and correction about uniformity of pixel intensities. Hence, the correction circuits 41Ca to 41Cd uses known techniques, such as weighting calculations, to perform a previously designated correction at each pixel of the respective frame data. Incidentally, the correction of the intensities includes correction for enhancing a designated X-ray energy bin by applying, to the frame data, different weighting factors for the respective X-ray energy bins.

The resultant corrected frame data $FD_{all}$, $FD_1$, $FD_2$ and $FD_3$ are sent repetitively to the affine transformation circuit 42. As shown in FIG. 5, this affine transformation circuit 42 is also provided with, in accordance with the four types of frame data, four affine transformation circuit 42A, 42B to 42D for the synthesized frame data and the first to third subtracted frame data, which are formed as hardware circuits and parallel with each other. Each affine transformation circuit 42A (to 42D) uses a subpixel technique to transform obliquely allocated frame data $FD_{all}$ ($FD_1$ to $FD_3$) illustrated in FIG. 6(A) to frame data in a first Cartesian coordinate system XYZ.

Resultant affine-transformed frame data $FD_{all}'$ ($FD_1'$, $FD_2'$, and $FD_3'$) are pictorially shown in FIG. 6(B). According to the subpixel technique, the pixel value of a pixel P' in the first Cartesian coordinate system XYZ can be defined by a sum of values of multiplication performed between: pixel values of two or more mutually adjacent pixels in the frame data $FD_{all}$ ($FD_1$, $FD_2$, and $FD_3$) in the second Cartesian coordinate system X'YZ', wherein the two or more mutually adjacent pixels each occupy and configure a part of the pixel P, and a ratio of areas of such mutually adjacent pixels which occupy the overall pixel P'. Practically, in an example shown in FIG. 6(C), a relationship of $P'=p_1 \times r_1 + p_2 \times r_2$ is realized, where $P_1$ and $P_2$ are pixel values of pixels P1 and P2 respectively and $r_1$ and $r_2$ are area ratios therebetween. In this pixel P' shown in FIG. 6(C), the pixel P' positions at an edge of the oblique frame data, thereby providing a relationship of $r_1 \leftrightarrows r_2 = r_{12}$ (<1). In a practical use, the values on this relationship can be sufficiently used as alternatives for the multiplication.

Figure 8:
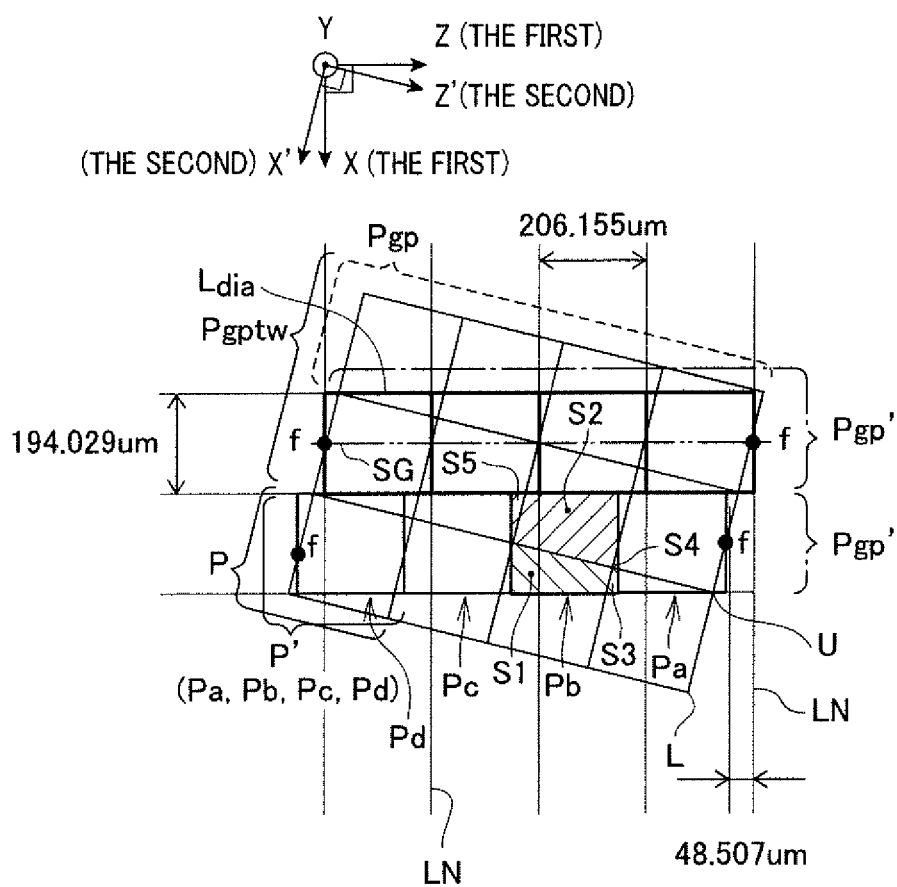
FIG. 8 is a diagram explaining the foregoing conversion in detail.

As described, the affine transformation is performed using the subpixel technique with the area ratios. Since the subpixel technique is one kind of the affine transformation, techniques other than this can be used by necessity. In the present embodiment, as detailed in FIGS. (A) and (B), and FIG. 8, in the foregoing calculation based on the subpixel technique, it is considered that there is a tilt angle α between the geometrical allocation of the pixels P of the detector 13 and the scan direction (the Z-axis direction) of the detector 13. Hence, thanks to this consideration, the present embodiment is uniquely featured such that an amount of calculation based on the subpixel technique can be reduced. FIG. 7(B) explains a partial region picked up from FIG. 7(A) and FIG. 8 is an enlarged view of FIG. 7(B).

This feature will now be detailed. In the present embodiment, the second Cartesian coordinate system X'Y'Z' can be expressed as shown in FIG. 7(A), (B) to have a tilt angle of α degrees to the first Cartesian coordinate system XYZ. The plurality of square pixels P, which are two-dimensionally arranged in the detector 13 with the plurality of modules M, are allocated in a grid pattern in the second Cartesian coordinate system X'YZ'.

As described, the detector 13 is provided with the two-dimensional pixel array composed of 20×2,348 pixels in the present embodiment. Thus, in the second Cartesian coordinate system X'YZ' which is tilted obliquely, there are 20 pixels P (in the row direction) in a lateral direction which is along the Z'-axis direction (having a tilt of α degrees to the scan direction Z), in which such pixels P contributes to the columns, respectively. In a longitudinal direction which is the X'-axis direction, 2,348 pixels are aligned as each column via the plurality of modules M. In the present embodiment, each pixel P is formed as a square of 200 μm×200 μm. In the longitudinal column direction, the mutually adjacent modules M are spaced apart from each other by a gap whose width is equal to the size of a side of the one pixel P.

In this geometrical configuration, of the pixels of each row, a single group of pixels Pgp ($Pgp_1$, $Pgp_2$, ..., Pgpn) consisting of four serially aligned pixels P can be recognized, when viewed from one right or left end in the row. This is illustrated in FIGS. 7(A) and (B) as a shaded area (indicating only one group of pixels). Hence, each row is composed of the group of five pixels P (i.e., a pixel group) (Pgp ($Pgp_1$, $Pgp_2$, ..., Pgp5). In addition, each pixel group Pgp provides, as a whole thereof, a rectangular area Rec as shown by the shaped area and the rectangular area has a diagonal line Ldia which is set to agree with the scan direction Z, that is, the lateral axis direction Z of the first Cartesian coordinate system XYZ. The tilt angle α is decided so as to realize this agreement between the diagonal line Ldia and the scan direction Z. In this way, the detector 13 is structured in the form which is referred to as an oblique detector, in which, at least, the X-ray incidence window MD is obliquely arranged by the tilt angle of α degrees in relation to the Z-axis direction (the scan direction) or the X-axis direction. In the present embodiment, from the foregoing geometrical conditions, by way of example, the tilt angle of α degrees is set to approximately 14.036±0.5 degrees. The term "oblique" of the oblique detector means a portion providing the X-ray incidence window MD is obliquely arranged, so that it is not always necessary to skew, for example, a cover portion of the detector 13.

The forgoing pixel group Pgp is virtually grouped in the second Cartesian coordinate system X'YZ'. The number of pixels P configuring this one pixel group Pgp is not always limited to four. The number of pixels P composing each virtually grouped pixel group depends on how the rectangular area (including a square area) is grouped and how its diagonal line Ldia is made to agree with the scan direction Z, that is, how the tilt angle α to the scan direction given to the detector 13 is decided. This will be detailed later as modifications.

Owing to the fact that the virtual diagonal line Ldia agrees with the scan direction Z, as can be understood from FIG. 7(A), the pixel group Pgp ($Pgp_1$, $Pgp_2$, ...) appears repeatedly as making a view advance in the Z'-axis direction in each row of pixels P of the detector 13 (however, at the upper and lower ends in the longitudinal direction, the pixel group appears only one time. The number of appearance times of the pixel group Ppg grows as advancing from the end in the X'-axis direction).

In this case, as illustrated in FIG. 8, an area Pgptw occupied by two-stage pixel groups Pgp mutually adjacent in the X'-axis direction of the second Cartesian coordinate system X'YZ' is imaginarily drawn. In this area Pgptw shown in FIG. 8, there can be imaginarily drawn a line segment SG connecting an X'-axis directional center f of the left side of the left-side pixel (i.e., a row pixel) located in the lower left-side pixel group Pgp and an X'-axis directional center f of the right side of the right-side pixel (i.e., a row pixel) located in the upper right-side pixel group Pgp. This line segment SG becomes parallel with the foregoing imaginary diagonal line Ldia. At the same time, this line segment SG also becomes parallel with the Z-axis direction (i.e., the scan direction). Then, imaginary lines LN can be drawn in the X-axis direction so as to divide the line segment SG into four equal segments and to be perpendicular to the Z-axis direction (i.e., the diagonal line Ldia and the lien segment SG). The "four" of the four equal division of the line segment results from the fact that each pixel group Pgp consists of four pixels P. The foregoing tilt angle α, which has been set as α=approx. 14.036±0.5 degrees, is derived from a relationship of "tan α=¼" (wherein the denominator "4" indicates the number "4" of pixel groups Pgp) with consideration for its error factor. That is, if each of the pixel groups Pgp is virtually composed of five pixels, it is preferred to equally divide the line segment in the same way as the above.

As shown in FIG. 8, for each of the pixel groups Pgp, it is therefore possible to imaginarily draw four pixels P' in the first Cartesian coordinate system XYZ. By way of another example, the point f is not always necessary to be positioned at the center of the side, but may be located at other positions, such as an upper or lower edge position U or L of an outer side of an original pixel P or an arbitrarily set position of such a side.

When each of the original pixels P is shaped into a square with a size of 200 μm×200 μm, the sizes of the above imaginarily drawn pixels P' are no longer a square, but be a rectangular whose lateral sides are slightly longer than their vertical sides, as can be understood from FIG. 7(B) and FIG. 8. In practice, the size of such a rectangle has a length of 206.155 μm in the Z-axial direction (corresponding to the lateral direction) and a length of 194.029 μm in the Y-axial direction (corresponding to the vertical direction). In this way, the respective pixel groups Pgp in the second Cartesian coordinate system X'YZ' can be imaginarily re-allocated (i.e., converted) to the original pixel groups Pgp' in the first Cartesian coordinate system XYZ. Hence, all the pixels P' in the first Cartesian coordinate system XYZ are expressed by designating the re-allocated pixel group Pgp' repeatedly in the Z-axis direction. Further, the pixel group Pgp' is re-allocated with a shift in the X'-axis direction (i.e., the oblique direction), in which its shift amount, that is, a shift amount between mutually adjacent pixels P' in the Z-axis direction (which also corresponds to a Z-axis directional shift amount between the centers f designated to the two pixel groups Pgp' mutually adjacently located in the X'-axis direction, is 48.507 μm in this example.

Hence, it is sufficient that conversion patterns necessary for re-allocating (i.e., converting), using the subpixel technique, the pixels from the second Cartesian coordinate system X'YZ' to the first Cartesian coordinate system XYZ are four types. The conversion patterns are defined by a combination of both positions of a plurality of pixels allocated in the second Cartesian coordinate system X'YZ', which such allocated pixels compose a pixel of interest in the first Cartesian coordinate system XYZ, and area ratios of such allocated pixels at the pixel of interest. The pixel groups corresponding to these four types of conversion patterns (which are also referred to as extrapolation patterns) appear repeatedly when viewing the pixels. As a result, the pixel conversion can be performed by repeatedly using the four types of conversion patterns.

The conversion patterns will now be detailed. FIG. 8, which is an enlarged view of FIG. 7(b), shows a pixel group Pgp' consigning of four pixels P' (Pa, Pb, Pc, Pd) lined up in each row. As can be understood from the drawing, each of the respective pixels P' in the first Cartesian coordinate system XYZ is configured by a combination of partial areas of a plurality of original pixels P which are mutually adjacently located in the second Cartesian coordinate system X'YZ'.

For example, when focusing attention on an arbitrary pixel Pb (a shaded area) in the first Cartesian coordinate system XYZ, this pixel Pb is configured by a combination of the partial areas S1 to S5 of five pixels mutually adjacently located in the second Cartesian coordinate system X'YZ'. These partial areas S1 to S5 have an area ratio of S1:S2:S3:S4:S5 (provided S1+S2+S3+S4+S5=1). If these five pixels have pixels values I1, I2, I3, I4 and I5, the focused pixel Pb has a pixel value Ib, which is obtained as $$Ib=S1\times I1+S2\times I2+S3\times I3+S4\times I4+S5\times I5 \qquad (1),$$

using the subpixel technique.

This calculation is also applied to the other pixels Ia, Ic and Id. This means that both the positions (i.e, the upper, lower, right and/or left positions) of pixels providing the partial areas, which come adjacent from the upper, lower, right and left sides to each pixel P' to be converted, and the patterns of the area ratios can be represented by the four pixels Pa, Pb, Pc and Pd (=pixel P'), as illustrated in FIG. 8. Namely, it is sufficient to have conversion patterns for generating the four types of pixels Pa, Pb, Pc and Pd, because this conversion can be repeated every pixel group Ppg' for all the pixels.

The four types of conversion patterns are pictorially shown in FIG. 9.

In this way, the pixel values of the respective pixels P'(Pa, Pb, Pc, Pd) in the first Cartesian coordinate system XYZ can be calculated by:
designating the positions of the respective pixels P', and
obtaining positions of a plurality of mutually-adjacent pixels P, an area ratio of those pixels P, and pixel values of those pixels P, in which the pixels P configure each of the designated pixels P' in the second Cartesian coordinate system X'YZ'.

Of these positions and values, the positions of the converted pixels P'(Pa, Pb, Pc, Pd) and the positions of the original pixels P providing partial areas which configure each of the pixels P' are specified by a circuit design, that is, design of the affine transformation circuit 42. Hence, the pixel values of the plural pixels P can be given by pixel-value calculation circuits for the respective pixels P' provided in the circuit. Further, the area ratios assigned to the respective pixels P' can be stored in advance in a memory provided in the affine transformation circuit 42, so that data indicating the area ratios are read from this memory at intervals. It is thus possible to easily obtain the pixel values of the respective pixels P'(Pa, Pb, Pc, Pd) by multiplying the respective pixel values of each of the designated original pixels P by an area ratio corresponding thereto, and then adding the multiplied values to each other.

Figure 10:
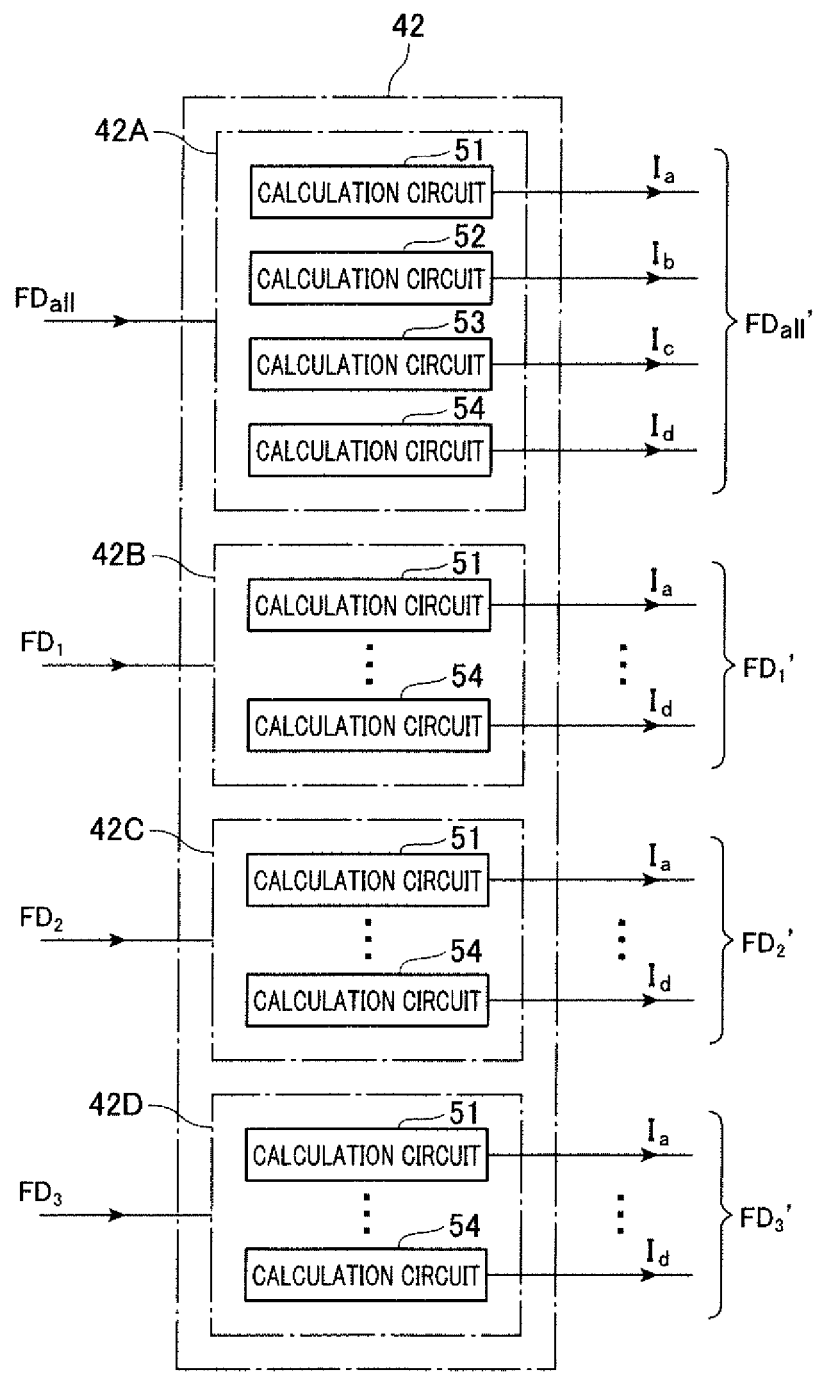
FIG. 10 is an explanatory diagram outlining the confifuration of an affine transformation circuit.
Figure 11:
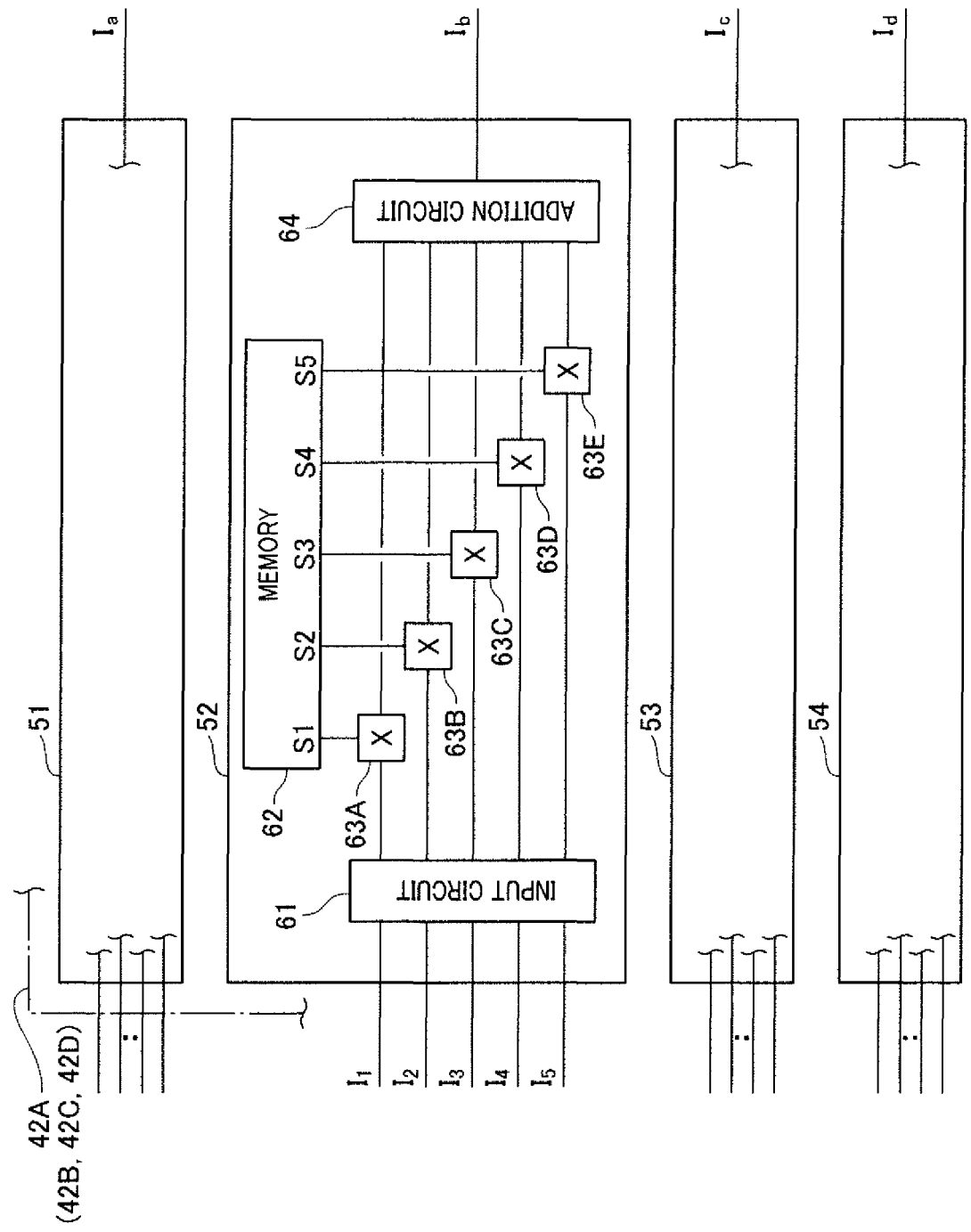
FIG. 11 is a block diagram explanting a detailed configuration of the affine transformation circuit.

FIG. 10 and FIG. 11 exemplify an outlined block diagram showing pipeline processing for the foreordering subpixel technique. As shown in FIG. 10, each of the affine transformation circuits, 42A (42B to 42D), is provided with four calculation circuits 51 to 54 for the affine transformation, which are assigned to frame data of different types, which are generated type.

The respective calculation circuits 51 to 54 are configured as shown in FIG. 11. This circuitry shown in FIG. 11 is exemplified based on a calculation circuit 52 capable of performing a pipeline process to the forgoing pixels Pb using the subpixel technique. In this calculation circuit 52, there is provided an input circuit 61 which receives, from the reception circuit 41, pixel values I1 to I5 at five pixels mutually adjacently located in the second Cartesian coordinate system X'YZ'. This input circuit 61 holds the received pixel values I1 to I5 temporally, and then outputs the pixel values to the next-staged multipliers 63A to 63E at the synchronized timing, respectively. At this synchronized timing, data indicating ratios S1, S2, S3, S4 and S5 of area occupation factors are read from a memory 62, and sent to the multipliers 63A to 63E, respectively. Thus each of the multipliers 63A to 63E is able to carry out the multiplication defined by the foregoing expression (1). In addition, at the output stages of the multipliers 63A to 63E, there is provided an addition circuit 64 which carries out the addition also defined in the foregoing expression (1). As a result, from the addition circuit 64, the pixel value Ib of the pixel of interest, which is subjected to conversion of the Cartesian coordinate axes, that is, being converted to the first Cartesian coordinate system XYZ, is outputted.

The other pixels Pa, Pc, and Pd in the first Cartesian coordinate system XYZ are also subjected to the pipeline process performed by the calculation circuits 51, 53 and 54. In the memories of these calculation circuits 51, 53 and 54, information showing an area ratio of partial area of a plurality of pixels composing and occupying each of the pixels Pa, Pc and Pd is stored in advance. As understood from FIG. 8, the number of area ratios is dependent on the positions of the pixels Pa to Pd. Hence, as to the pixels Pa, Pc and Pd, the calculation circuits 51, 53 and 54 calculate pixel values Ia, Ic and Id in the same way, respectively. In this way, for example, the respective pixels P' belonging to the one pixel group $Pgp_1$ are affine-transformed in parallel.

This affine transformation (in this embodiment, conversion of the Cartesian axes) is performed to return the second Cartesian coordinate system X'YZ' to the first Cartesian coordinate system XYZ. As a result of this return, the converted pixels P' are not square as shown by the original pixels P, but rectangular such that each of the pixels P' has a slightly elongated lateral size and a slightly shortened longitudinal size. In the embodiment, as shown in FIG. 7(B) and FIG. 8, each of the pixels P' is formed into a rectangle of 206.155 μm×194.019 μm.

At a timing when the affine transformation of the four pixels Pa to Pd belonging to the foregoing one pixel group $Pgp_1$ has been completed, pixel data of the next pixel group $Pgp_2$ is inputted and held in the input circuit of each of the calculation circuits 51 to 54. Hence, at the next synchronized timing, the input circuits 61 outputs pixel values I1 to I5 in the same way as the forgoing. This makes it possible to concurrently perform the affine transformation for the four pixels P' virtually forming the next pixel group $Pgp_2$.

In the same way as the above, the affine transformation, which is a transform of the pixels in the second Cartesian coordinate system X'YZ' to pixel values in the first Cartesian coordinate system XYZ, is repeatedly executed at the intervals for all the pixel groups Ppg, that is, for all the pixels P of the detector 13.

Further, this repeated calculation is carried out in each of the four affine transformation circuits 42A to 42D in the concurrent and same manner. Hence, the foregoing four types of frame data, that is, the synthesized frame data and the first, second and third subtracted frame data are subjected to the foregoing affine transformation in parallel, every pixel group, and in sequence.

Hence, data of the pixels P' converted to the first Cartesian coordinate system XYZ by the affine transformation are provided to the next-staged sorting circuit 43 provided with four sorting circuits 43A to 43D dedicated to the synthesized frame data and the first, second and third subtracted frame data. Hence the data of the converted pixels P' are outputted to the sorting circuits 43A to 43D, in parallel, every type of frame data $FD_{all}'$ ($FD_1'$, $FD_2'$, $FD_3'$) and every pixel.

Figure 12:
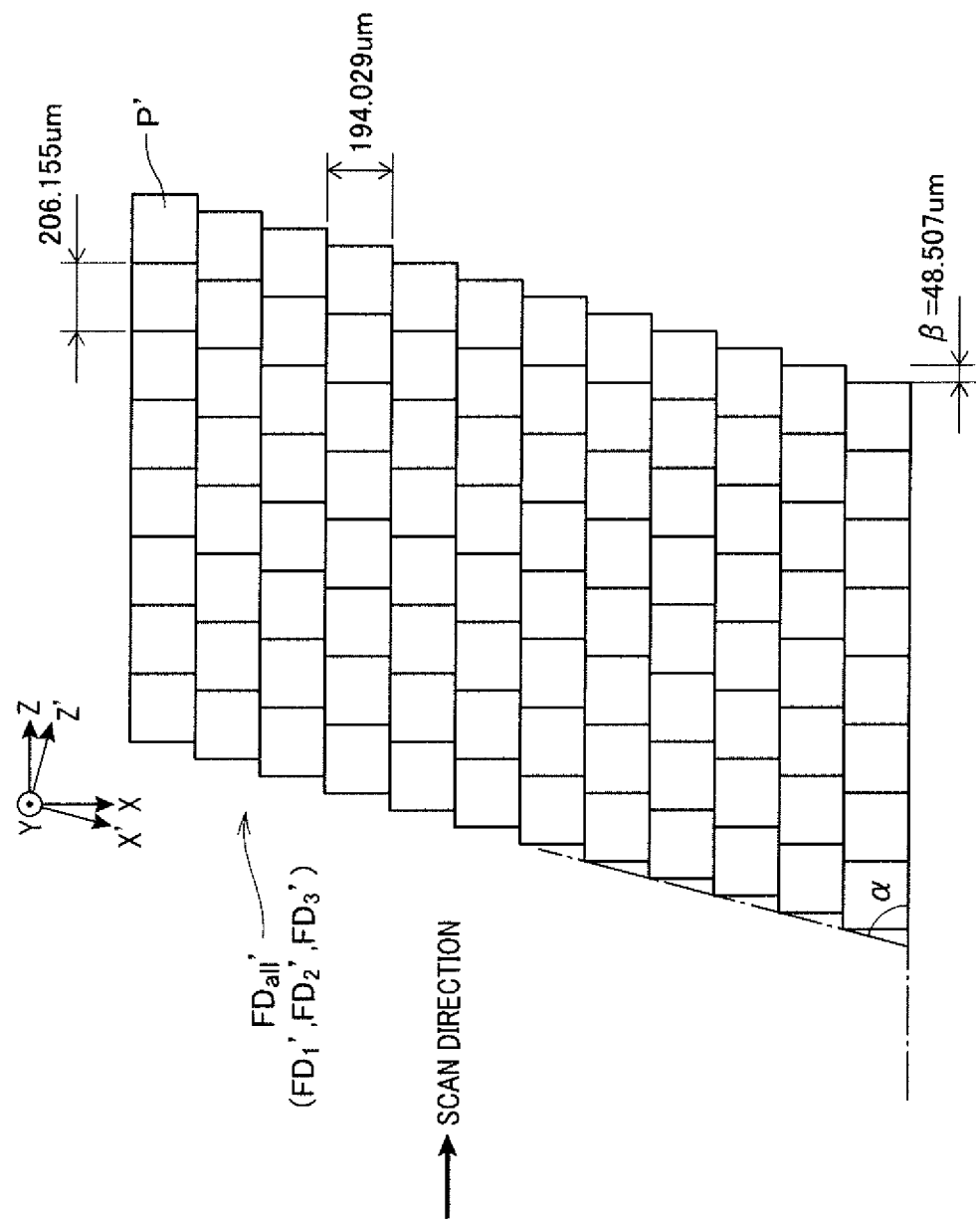
FIG. 12 is an illustration explaining sorting processes of the pixels, which is performed by a sorting circuit installed in the processor.

Each of these four sorting circuits 43A to 43D is provided with a memory and a writing/reading circuit, in which as shown in FIG. 12, the writing/reading circuit maps the inputted pixels P' (for example, 206.155 μm×194.029 μm) in a virtual space in the memory sequentially, every row and every column of the original pixels P. In is this process, the mapping is not carried out by neatly aligning the lateral and longitudinal pixels, but is carried out obliquely as shown in FIG. 12. That is, each row of the inputted pixels P' is shifted slightly, row by row, in the Z-axis direction (the scan direction) by a predetermined length β (=48.507 μm). Practically, the respective pixels P' have the rectangular size as described and are formed in the first Cartesian coordinate system XYZ, but are shifted row by row in the Z-axis direction so that, as a whole, there is provided an oblique and rectangular allocation of the frame data $FD_{all}'$ ($FD_1'$, $FD_2'$, $FD_3'$). This shift amount β is set to correspond to the pixel mapping according to the oblique arrangement angle α=14.036 degrees of the detector 13.

The frame data $FD_{all}'$ ($FD_1'$ $FD_2'$, $FD_3'$) produced as above is provided to the next-staged reconstruction circuit 44. In this reconstruction circuit 44, as pictorially shown in FIG. 13(A), the frame data $FD_{all}'$ ($FD_1'$, $FD_2'$, $FD_3'$) are processed with a shift & add calculation which uses a shift amount synchronized with, for example, the moving speed of the conveyor belt 11, but under an assumption that there is no shift amount β for the oblique mapping. In this example, the shift amount used in the shift & add calculation is defined as a distance shifted between pixels in the scan direction when the pixel values of two or more pixels are added to each other. As a result, for example, as pictorially shown in FIG. 13(B), an oblong rectangular (i.e., a parallelogram) image $IM_{all}$ ($IM_1$, $IM_2$, $IM_3$) is reconstructed at each shift add timing. The resultant reconstructed images are then provided to the focused-image generating circuit 45, in which, by way of example, the images are subjected to various processes explained by FIG. 11 and thereafter in the foregoing known publication WO2015/111728 A1. By this processing, focused images for foreign-matter inspection are generated for instance. Of course, material identification for foreign matter can be performed using a technique disclosed by this publication.

Thus the X-ray apparatus according to the present embodiment can provide various advantageous effects, which are described below.

First of all, in the detector 13, the plurality of modules M are arranged obliquely to the scan direction, so that this oblique arrangement provides an effect that reduces influence occurring due to the fact that there is no pixels in the gap formed between the modules. In addition, there is an advantage gained by obtaining pixel values from a plurality of pixels positioned closely to each other, by using the subpixel technique, when converting (i.e., affine-transforming) the axes according which pixels are defined in the reconstruction space, that is, the object space. With this configuration, there can be provided an effect that suppresses various irregularities among the pixels (such as variations in manufacturing accuracy of the pixels and/or photon noise). Images with less noise can thus be reconstructed. Moreover, thanks to the oblique arrangement of the plurality of modules M, deterioration in the resolution can be minimized and digitally-occurring anisotropic distortion of the resolution can be lessened.

Further, in the embodiment, the detector 13 is arranged obliquely by approx. 14.036 degrees to the scan direction (the Z-axis direction), resulting in that the scan direction is made to agree with the direction of the diagonal Ldia of each row of a plurality of pixels each of which is the square original pixel P having isotropic resolution in both the lateral and longitudinal directions (that is, each row consists of each pixel group Pgpn composed the foregoing four pixels P). In this oblique arrangement, it is not necessary to tilt the detector 13 to the scan direction at extremely deeper angles, while still maintaining the foregoing advantage thanks to the oblique arrangement.

In addition, the number of conversion patterns necessary for the affine transformation of the pixels from the second Cartesian coordinate system X'YZ' in which the oblique arrangement is defined, to the first Cartesian coordinate system XYZ for the reconstruction is limited to a smaller value. The memory capacity for the affine transformation can also be minimized.

In this way, the oblique arrangement of the detector 13 uses the diagonal line Ldia which makes it possible to, in addition to compensation of pixel loss in the gap between modules, secure both a certain amount of scanning width and a longer detector length, and reduce both the volume of circuity and the amount of calculation which are necessary for the affine transformation.

[Second Embodiment]

As shown in FIG. 12, the foregoing embodiment provides the reconstruction circuit 44 receives the tilted oblong frame data $FD_{all}'$ ($FD_1'$, $FD_2'$, $FD_3'$) and applies the shift and add calculation to those frame data with no taking the shift amount β into account. Namely, this calculation is carried out by assuming that there is no such a shift amount in the scan direction (in the Z-axis direction). However, this shift and add calculation can be performed in a different reconstructing modification.

First, an X-ray apparatus according to this modification is provided with a reconstruction circuit 81. This circuit 81, which is a replacement for the foregoing reconstruction circuit 44, is configured by, for example, FPGA (field-programmable gate array) circuits.

This reconstruction circuit 81 is provided with a pixel division circuit 82 which receives the frame data $FD_{all}'$ ($FD_1'$, $FD_2'$, $FD_3'$) shown in FIG. 12 and a memory 83 which stores therein image data divided by the pixel division circuit 82. This pixel division circuit 82 is configured to divide the area of each of the pixels of the tilted oblong frame data $FD_{all}'$ ($FD_1''$, $FD_2''$, $FD_3''$) shown in FIG. 12, into a quarter area and produce frame data $FD_{all}'$ ($FD_1''$, $FD_2''$, $FD_3''$) composed of finer rectangular small pixels P''' (for example, the pixel size is 97.015 μm×103.0775 μm).

Figure 15:
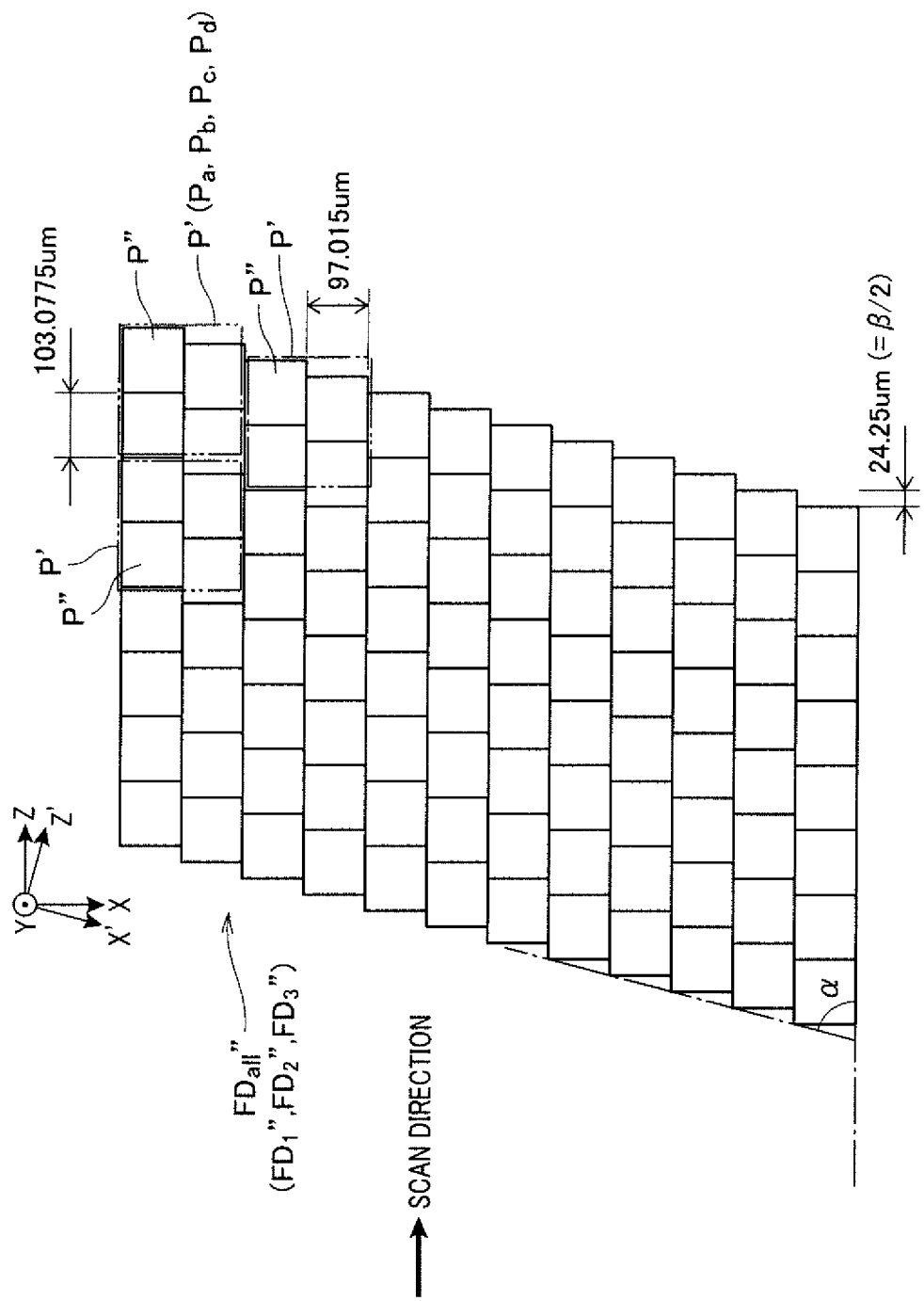
FIG. 15 is an illustration explaining divisions of the pixels, which is performed as a preprocess for a reconstruction process in the second embodiment.

In this generation, the pixel division circuit 82 reads, from a weighting table 84, weighting coefficients (corresponding to the conversion patterns on the foregoing subpixel technique) which are required to divide the before-divided pixels P' to the small pixels P'''. The circuit 82 then uses the read weighting coefficients to generate the small pixels P''' by multiplying the pixel values of the before-divided is pixels P' by the weighting coefficients. As shown from FIG. 15, a geometrical relationship between the single before-divided pixel P' and its quartered small pixel P''' is very simple, so that the division can be performed simply using weighting coefficients of 16 patterns. Hence, the calculation load can be reduced.

The pixel division circuit 82 further stores, in the memory 83, image data of the frame data $FD_{all}'$ ($FD_1''$, $FD_2''$, $FD_3''$) composed of the small pixels P''', with still maintaining a shift amount β/2 of each pixel row in the scan direction (the Z-axis direction) in the memory 83.

Figure 14:
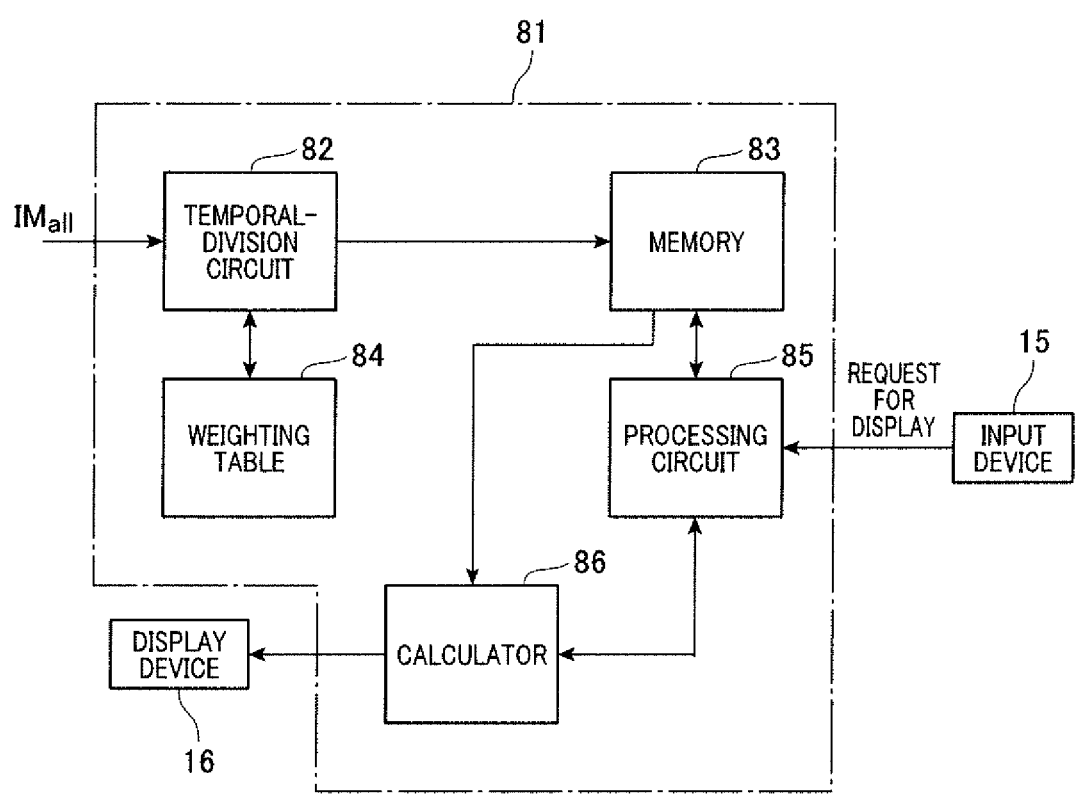
FIG. 14 is a block diagram outlining a reconstruction circuit employed by an X-ray apparatus (for example, an X-ray foreign-matter inspection apparatus) according to a second embodiment.

As shown in FIG. 14, the reconstruction circuit 81 is further provided with a processing circuit 85. By way of example, this processing circuit 85 is configured to be a CPU. Hence, when the processing circuit 85 receives a display request via the input device 15 or by default, the processing circuit 85 sends a command to a calculator 86 so as to enable the calculator 86 to read from the memory 83 the frame data $FD_{all}''$ ($FD_1''$, $FD_2''$, $FD_3''$).

Figure 16:
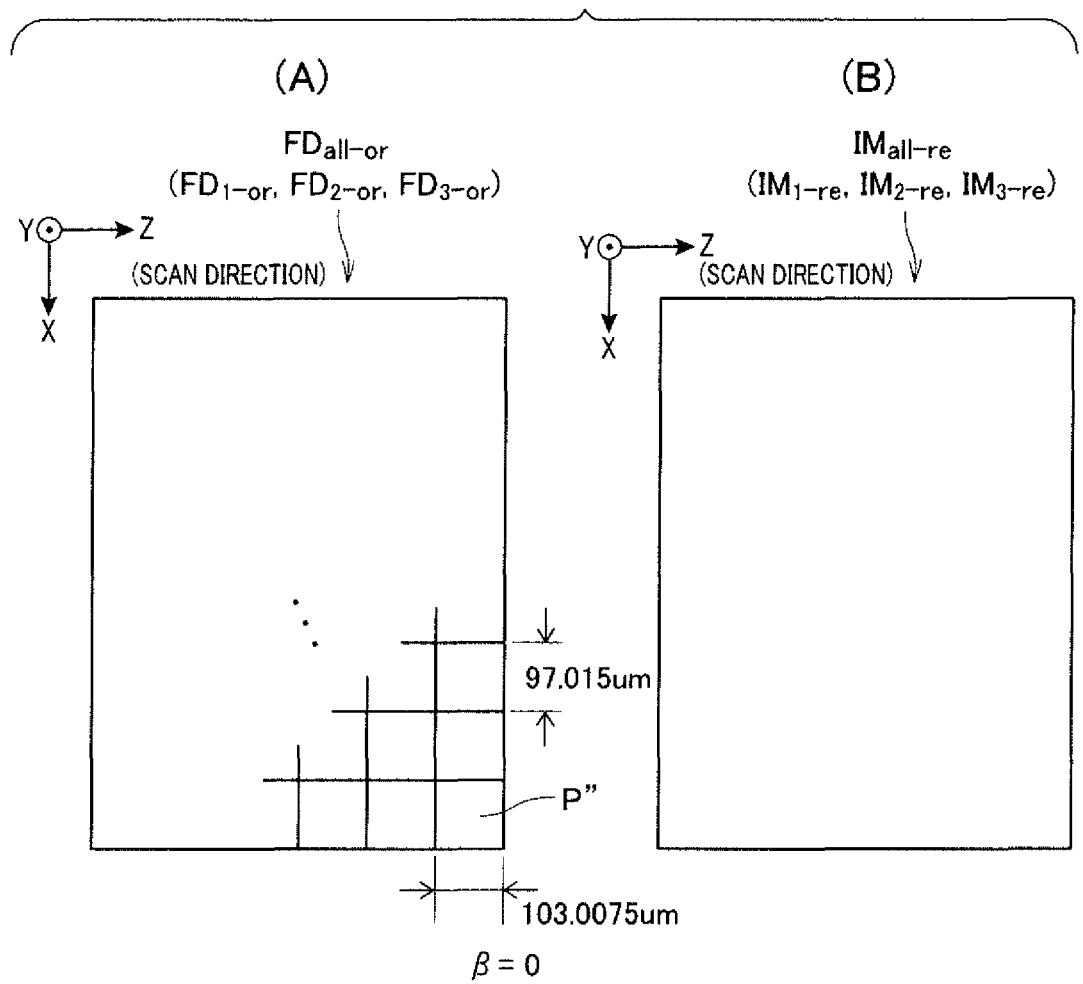
FIG. 16 is an illustration pictorially explaining the reconstruction process performed in the second embodiment.

The calculator 86 applies a coordinate conversion to the frame data $FD_{all}''$ ($FD_1''$, $FD_2''$, $FD_3''$) in which the pixels are mapped as a whole in a tilted oblong form, so that the frame data is converted into those of the first artesian coordinate system XYZ. This results in generation of frame data $FD_{all-or}$ ($FD_{1-or}$, $FD_{2-or}$, $FD_{3-or}$), as pictorially shown in FIG. 16(A). Then, by applying the shift & add calculation to the resultant frame data $FD_{all-or}$ ($FD_{1-or}$, $FD_{2-or}$, $FD_{3-or}$), an image is reconstructed as shown in FIG. 16(B), in which reconstructed images $IM_{all-re}$ ($IM_{1-re}$, $IM_{2-re}$, $IM_{3-re}$) is generated as images mapped in the first Cartesian coordinate system XYZ. Such reconstructed images are presented by the display device 16.

As a variation, the calculator 85 can use the frame data $FD_{all}''$ ($FD_1''$, $FD_2''$, $FD_3''$) read rom the memory 84 to perform other types of processing, such as material identification, not being limited to the display as above. In such a modification, the coordinate conversion to the fame data $FD_{all-or}$ ($FD_{1-or}$, $FD_{2-or}$, $FD_{3-or}$) shown in FIG. 16(A) is not always essential, but the tilted oblong frame data $FD_{all}''$ ($FD_1''$, $FD_2''$, $FD_3''$) can be processed without being changed in the coordinate system.

As described, in the X-ray apparatus according to the second embodiment, the advantages obtained in the first embodiment can also be enjoyed, and there can be provided an additional advantage that various types of processing can be conducted at higher accuracy because the pixels of the frame data can be finer by the foregoing pixel division. In addition, when a display request is issued, the reconstructed images $IM_{all-re}$ ($IM_{1-re}$, $IM_{2-re}$, $IM_{3-re}$) according to the first Cartesian coordinate system XYZ are displayed, thus eliminating in distortion in the images, thus it is easier to observe the images and provide images with higher precision.

[Modifications]

Figure 17:
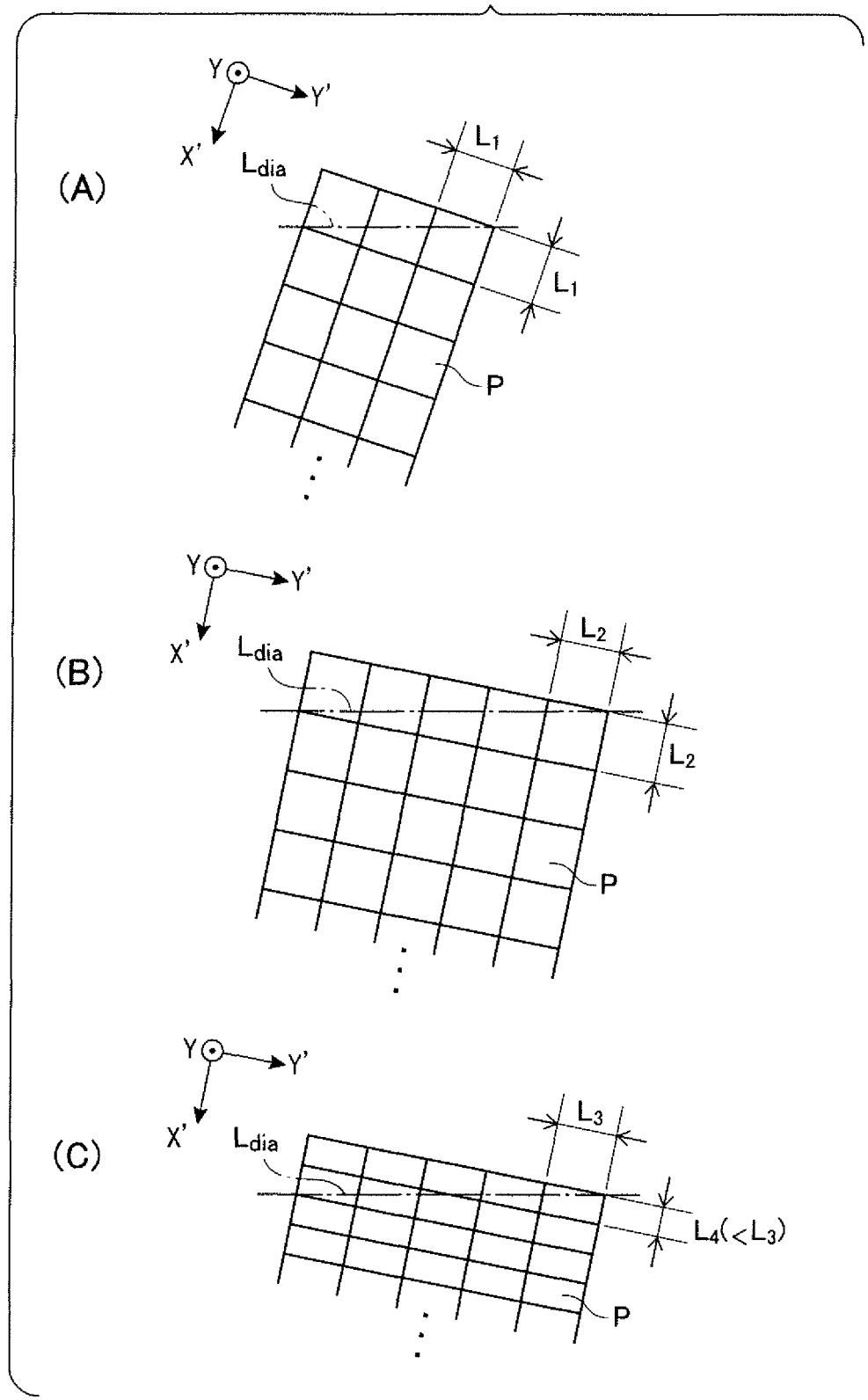
FIG. 17 is an illustration showing various modifications in each of which an oblique angle to the scan direction is set, when the oblique detector is arranged, by referring to a diagonal line provided by a row of pixels.

The foregoing first and second embodiments exemplify the pixel groups Pgpn composed of pixel lines each consisting of one row and four columns in the Z' and X' directions. Alternatively pixel lines composed of one row and three columns (refer to FIG. 17(A)), one row and five columns (refer to FIG. 17(B)), two rows and five columns (refer to FIG. 17(C)), or other lines can be used. In summary, it is sufficient if the pixel line meets a condition that "when viewing from any one of sides in the scan direction, a pixel group is provided solely or repeatedly, the pixel group being composed of "M rows×N pieces" of pixels (M is a positive integer equal to or larger than 1, N is a positive integer equal to or larger than 2, and M and N have a relationship of prime numbers), the group of pixels providing a quadrangle whose diagonal line is parallel with the scan direction such that the oblique arrangement is provided". The number of foregoing conversion patterns are three (in the case of FIG. 17(A)), five (in the case of FIG. 17(B)), and eight (in the case of FIG. 17(C). In addition, each of the pixels P of the detector 13 is not always limited to square in shape, but may be rectangular as shown in FIG. 17(C). These modifications are also able to compensate for defects due to no pixels between modules arranged obliquely as described and provide various advantage such as simplified calculation.

It is also possible to simplify a process for reconstructing multiple layers described in the foregoing publication WO2015/111728 A1, thereby providing images with less artifacts occurring during the reconstruction.

Furthermore, in the foregoing first and second embodiments and their modifications, a reconstructed image can be provided, which has pixels obtained by ordinal image reconstruction or image reconstruction which uses the foregoing mapping. In such a reconstructed image, the image is displayed as it is, and measurement with pixel size compensated can be performed only when distance measurement and/or angle measurement is desired to be performed. This process can be conducted by the processing apparatus 14 or the calculator 86.

In the foregoing first and second embodiments and their modifications, the display device 16 can be replaced by a monitor in which an aspect ratio for display can be adjusted to the same value. In this case, when making the display device 16 present reconstructed images with anisotropic pixels, the aspect ratio of 1:1 is commanded to the display device 16 so that the pixels are adjusted to this aspect ratio of 1:1 on the screen, on which a distance and/or an angle can be measured. This process can be conducted by interface measures functionally realized by using the input device 15 and the processing apparatus 14 or the calculator 86.

REFERENCE SIGNS LIST

1 X-ray apparatus(x-ray foreign-matter inspection apparatus)
12 X-ray generator
13 detector
14 processor
15 input device
16 display device
22 X-ray tube
41 reception circuit
41A signal acquisition circuit
41B frame data generating circuit
41C correction circuit
42 affine transformation circuit
43 sorting circuit
44,81 reconstruction circuit
82 pixel division circuit
83 memory
84 weighting table
85 processing circuit
86 calculator
M module
P, P', P" pixel
XYZ the first Cartesian coordinate system (coordinate system necessary for reconstruction)
X'YZ' the second Cartesian coordinate system (coordinate system according to oblique arrangement of detector)

What is claimed is:

1. An X-ray apparatus comprising:
    a detector provided with a two-dimensional pixel array, the two-dimensional pixel array having a plurality of pixels each being shaped into a rectangular, having a predetermined size and outputting an electrical signal in response to an incident X-ray photon, the plurality of pixels being allocated in mutually-orthogonal row and column directions both configuring a second Cartesian coordinate system, the row direction being oblique to a scan direction with a predetermined angle; and
    a processor that processes as a two-dimensional frame data the signals outputted at a constant period from the respective pixels of the two-dimensional pixel array, wherein the two-dimensional pixel array is allocated such that, when viewing from any one of sides in the scan direction, a pixel group is provided solely or repeatedly, the pixel group being composed of "M rows×N pieces" of pixels (M is a positive integer equal to or larger than 1, N is a positive integer equal to or larger than 2, and M and N have a relationship of prime numbers), the group of pixels being arranged in a quadrangle whose diagonal line is parallel with the scan direction such that the oblique arrangement is provided, and
    the processor is provided with conversion means which converts at the constant periods the frame data, outputted at the constant period from the respective pixels of the two-dimensional pixel array, to frame data in a first Cartesian coordinate system configured in a memory space, the first Cartesian coordinate system having a row direction which is set to accord with the scan direction and a column direction orthogonal to the row direction.

2. The X-ray apparatus of claim 1, wherein the conversion means are configured to convert, period by period, the frame data outputted at the constant period from the respective pixels of the two-dimensional pixel array, to the frame data in the second Cartesian coordinate system, the converted frame data being defined based on intersections between axes along the column direction of the second Cartesian coordinate system and the diagonal line.

3. The X-ray apparatus of claim 1, wherein the processor comprises
    reallocating means for generating frame data whose pixels aligned along the column direction are reallocated obliquely at the predetermined angle but along the column direction, by shifting, at the constant period, in the memory space, the respective frame data converted by the conversion means and allocated in the second Cartesian coordinate system, every row of the second Cartesian coordinate system, by predetermined amounts in the scan direction; and
    signal processing means for performing the process based on the frame data reallocated period by period by the reallocating means.

4. The X-ray apparatus of claim 3, wherein the signal processing means comprises image reconstruction means for reconstructing an image based on the frame data subjected to the scanning and reallocated by the reallocating means.

5. The X-ray apparatus of claim 4, wherein the image reconstruction means is configured to reconstruct, into a two-dimensional image, the pixels reallocated at the predetermined oblique angle by the reallocating means on an assumption that the allocated pixels are pixels in a Cartesian coordinate system which does not have the shift amount.

6. The X-ray apparatus of claim 5, wherein the X-ray apparatus comprises mapping means for mapping pixels of the image reconstructed by the image reconstruction means to an image in the Cartesian coordinate system which does not have the shift amount in the row direction based on a subpixel technique, depending on the shift amount in the row direction, the mapped image having pixels whose size is maintained at a size of each of the pixels of the reconstructed image.

7. The X-ray apparatus of claim 1, wherein the number M of the "M rows×N pieces" of pixels is 1 and the number N thereof is 4.

8. The X-ray apparatus of claim 1, wherein
    the conversion means comprises:
    first specifying means for specifying, aggregation by aggregation, positions of aggregations of the pixel group composed of the "M rows×N pieces" pixels in the first Cartesian coordinate system, the pixel groups being allocated at a same geometrical repetition in the first Cartesian coordinate system;

second specifying means for specifying respective positions of the pixels composing each of the pixel aggregations in the first Cartesian coordinate system;

storing means in which conversion information is previously stored, the conversion information indicating both i) the positions of pixels, specified by the second specifying means, each partially occupying each of the respective pixels of the second Cartesian coordinate system and being and ii) a ratio of areas of one or a plurality of pixel portions composing each of the pixels in the second Cartesian coordinate system, the pixel portions being adjacent to the partially occupying pixels; and frame data conversion means for applying a subpixel technique to the frame data in the first Cartesian coordinate system based on the conversion information so as to convert the frame data in the first Cartesian coordinate system to the frame data in the second Cartesian coordinate system, for each of the pixel groups specified by the first specifying means and for each of the pixels of the pixel groups specified by the second specifying means.

9. The X-ray apparatus of claim 8, wherein
the conversion means comprises:
division means for dividing, in the frame data obtained from the pixels of the two-dimensional pixel array, in the memory space, pixels belong to at least one selected from pixel groups of the M row and pixel groups of the N pieces into pixels smaller in size than the pixels belonging to the selected pixel groups, for every pixel group of the "M rows×N pieces", and
the first specifying means is configured to specify positions of the pixel groups divided by the division means, in the first Cartesian coordinate system, for each of the divided pixel groups.

10. The X-ray apparatus of according to claim 1, wherein the detector is a direct-conversion type of semiconductor detector which responds to incidence of a photon of the X-rays and outputs an electrical signal depending on an intensity of the X-rays.

11. The X-ray apparatus of according to claim 1, wherein
the respective pixels of the two-dimensional pixel array of the detector consist of isotropic-size pixels having longitudinal and lateral sizes which are equal to each other, and
the respective pixels in the second Cartesian coordinate system, which are converted by the conversion means, have anisotropic-size pixels having longitudinal and lateral sizes which are different from each other.

12. The X-ray apparatus of according to claim 1, wherein the respective pixels of the two-dimensional pixel array of the detector consist of anisotropic-size pixels having longitudinal and lateral sizes which are different from each other.

13. An X-ray detecting system comprising a detector detecting X-rays,
wherein the detector comprises a two-dimensional pixel array, the two-dimensional pixel array having a plurality of pixels each being shaped into a rectangular, having a predetermined size and outputting an electrical signal in response to an incident X-ray photon, the plurality of pixels being allocated in mutually-orthogonal row and column directions both configuring a first Cartesian coordinate system, and
a support body supporting the two-dimensional pixel array so as to arrange the two-dimensional pixel array obliquely such that the row direction corresponds to a scan direction,
wherein the two-dimensional pixel array is allocated such that, when viewing from any one of sides in the scan direction, a pixel group is provided solely or repeatedly, the pixel group being composed of "M rows×N pieces" of pixels (M is a positive integer equal to or larger than 1, N is a positive integer equal to or larger than 2, and M and N have a relationship of prime numbers), the group of pixels being arranged in a quadrangle whose diagonal line is parallel with the scan direction.

14. The X-ray detecting system of claim 13, wherein the detector comprises a plurality of modules mutually adjacently arranged with a gap provided therebetween, each of the modules having the two-dimensional pixel array.

15. A data processor processing data outputted from the X-ray detecting system according to claim 13, comprising
reception means for receiving, as two-dimensional frame data, signals outputted at constant intervals from the respective pixels of the two-dimensional pixel array, and
conversion means configured to convert, period by period, the frame data received by the reception means to the frame data in the second Cartesian coordinate system, the converted frame data being defined based on intersections between axes along the column direction of the second Cartesian coordinate system and the diagonal line.

16. The data processor of claim 15, wherein
the conversion means are configured to convert, period by period, the frame data outputted at the constant period from the respective pixels of the two-dimensional pixel array, to the frame data in the second Cartesian coordinate system, the converted frame data being defined based on intersections between axes along the column direction of the second Cartesian coordinate system and the diagonal line.

17. The data processor of claim 15, wherein the data processor comprises
reallocating means for generating frame data whose pixels aligning along the column direction are reallocated obliquely at the predetermined angle but along the column direction, by shifting, at the constant period, in the memory space, the respective frame data converted by the conversion means and allocated in the second Cartesian coordinate system, every row of the second Cartesian coordinate system, by predetermined amounts in the scan direction; and
signal processing means for performing the process based on the frame data reallocated period by period by the reallocating means.

18. The data processor of claim 15, wherein the conversion means comprises
first specifying means for specifying, aggregation by aggregation, positions of aggregations of the pixel group composed of the "M rows×N pieces" pixels in the first Cartesian coordinate system, the pixel groups being allocated at a same geometrical repetition in the first Cartesian coordinate system;
second specifying means for specifying respective positions of the pixels composing each of the pixel aggregations in the first Cartesian coordinate system;
storing means in which conversion information is previously stored, the conversion information indicating both i) the positions of pixels, specified by the second specifying means, each partially occupying each of the respective pixels of the second Cartesian coordinate system and being and ii) a ratio of areas of one or a plurality of pixel portions composing each of the pixels in the second Cartesian coordinate system, the pixel portions being adjacent to the partially occupying pixels; and frame data conversion means for applying a subpixel technique to the frame data in the first Cartesian coordinate system based on the conversion information so as to convert the frame data in the first Cartesian coordinate system to the frame data in the second Cartesian coordinate system, for each of the pixel groups specified by the first specifying means and for each of the pixels of the pixel groups specified by the second specifying means.

19. A method of processing data outputted from the X-ray defecting system according to claim 13, comprising steps of:

receiving, as two-dimensional frame data, signals outputted at constant intervals from the respective pixels of the two-dimensional pixel array, and converting, period by period, the received frame data to the frame data in the second Cartesian coordinate system, the converted frame data being defined based on intersections between axes along the column direction of the second Cartesian coordinate system and the diagonal line.

20. The method of claim 19, comprising steps of:

generating frame data whose pixels are aligned along the row direction are reallocated obliquely at the predetermined angle but along the column direction, by shifting, at the constant period, in the memory space, the respective converted frame data converted and allocated in the second Cartesian coordinate system, every row of the second Cartesian coordinate system, by predetermined amounts in the scan direction; and performing the process based on the frame data reallocated period by period.

* * * * *